(12) United States Patent
Ibuki

(10) Patent No.: US 8,179,122 B2
(45) Date of Patent: May 15, 2012

(54) CURRENT/VOLTAGE DETECTION PRINTED BOARD AND CURRENT/VOLTAGE DETECTOR

(75) Inventor: Yoshifumi Ibuki, Osaka (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 12/201,295

(22) Filed: Aug. 29, 2008

(65) Prior Publication Data

US 2009/0058398 A1   Mar. 5, 2009

(30) Foreign Application Priority Data

Aug. 31, 2007   (JP) .................................. 2007-227187

(51) Int. Cl.
*G01R 15/18* (2006.01)

(52) U.S. Cl. ................. 324/127; 324/117 H; 324/117 R; 324/126

(58) Field of Classification Search .......... 336/200–232; 324/117 R

See application file for complete search history.

(56) References Cited

U.S. PATENT DOCUMENTS

| | | | |
|---|---|---|---|
| 4,675,607 A * | 6/1987 | Golker et al. ................. 324/247 |
| 4,794,327 A | 12/1988 | Fernandes | |
| 4,794,328 A | 12/1988 | Fernandes et al. | |
| 5,414,400 A | 5/1995 | Gris et al. | |
| 5,473,244 A | 12/1995 | Libove et al. | |
| 5,929,735 A * | 7/1999 | Heinrich ........................ 336/61 |
| 6,366,076 B1 * | 4/2002 | Karrer et al. ............... 324/117 R |
| 6,380,727 B1 * | 4/2002 | Jitaru ........................ 324/117 R |
| 6,624,624 B1 * | 9/2003 | Karrer et al. .............. 324/117 R |
| 6,661,324 B1 | 12/2003 | Gilmore | |
| 6,708,123 B2 | 3/2004 | Gerrish | |
| 7,158,012 B2 | 1/2007 | Wiesman et al. | |
| 7,227,442 B2 * | 6/2007 | Skendzic ...................... 336/229 |
| 7,579,824 B2 * | 8/2009 | Rea et al. .................. 324/117 R |
| 7,714,594 B2 * | 5/2010 | Ibuki et al. ..................... 324/658 |
| 2003/0090356 A1 | 5/2003 | Saito et al. | |
| 2003/0137388 A1 | 7/2003 | Meier et al. | |
| 2003/0184319 A1 | 10/2003 | Nishimori et al. | |
| 2003/0214313 A1 | 11/2003 | Omura et al. | |
| 2004/0178875 A1 | 9/2004 | Saito | |
| 2005/0156587 A1 * | 7/2005 | Yakymyshyn et al. ... 324/117 R |
| 2005/0215642 A1 * | 9/2005 | Magdolen et al. ............ 514/565 |
| 2007/0194797 A1 | 8/2007 | Ibuki et al. | |

(Continued)

FOREIGN PATENT DOCUMENTS

JP    6-176947    6/1994

(Continued)

OTHER PUBLICATIONS

English language Abstract of JP 2003-302431, Oct. 24, 2003.

(Continued)

*Primary Examiner* — Huy Q Phan
*Assistant Examiner* — Richard Isla Rodas
(74) *Attorney, Agent, or Firm* — Greenblum & Bernstein, P.L.C.

(57) ABSTRACT

A printed board, includes: a first shield portion, configured to reduce an influence of an electric field in combination with a casing accommodating the printed board, at least a part of the first shield portion being formed with a plurality of through holes; and a second shield portion, configured to reduce the influence of the electric field in combination with the casing, at least a part of the second shield portion being formed with a plurality of through holes, wherein the second shield portion is arranged alongside of the first shield portion.

20 Claims, 20 Drawing Sheets

U.S. PATENT DOCUMENTS

| | | |
|---|---|---|
| 2007/0285089 A1 | 12/2007 | Ibuki et al. |
| 2008/0048646 A1* | 2/2008 | Wilkerson et al. ............ 324/127 |
| 2008/0106253 A1* | 5/2008 | Kojovic ........................ 324/127 |
| 2011/0115466 A1* | 5/2011 | Ibuki et al. ................. 324/76.11 |
| 2011/0285412 A1* | 11/2011 | Ibuki et al. .................... 324/686 |

FOREIGN PATENT DOCUMENTS

| | | |
|---|---|---|
| JP | 2003-130894 | 5/2003 |
| JP | 2003-302431 | 10/2003 |
| JP | 2003-315373 | 11/2003 |
| JP | 2004-14925 | 1/2004 |
| JP | 2004-85446 | 3/2004 |
| JP | 2004-119926 | 4/2004 |

OTHER PUBLICATIONS

English language Abstract of JP 2004-85446, Mar. 18, 2004.
Japan Office action, dated Jun. 21, 2011 along with an english translation thereof.
Japanese office action, dated May 31, 2011, along with an english translation thereof.

\* cited by examiner

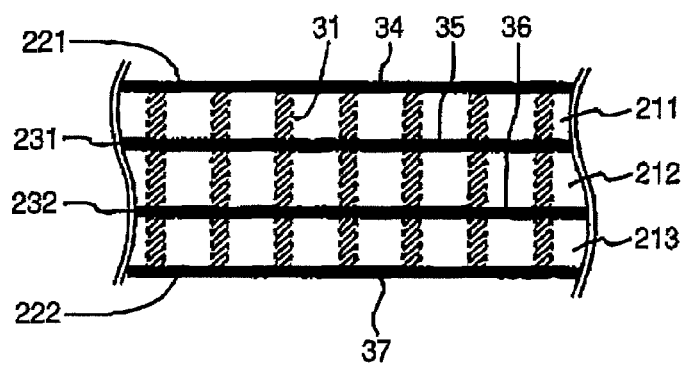
FIG. 11A
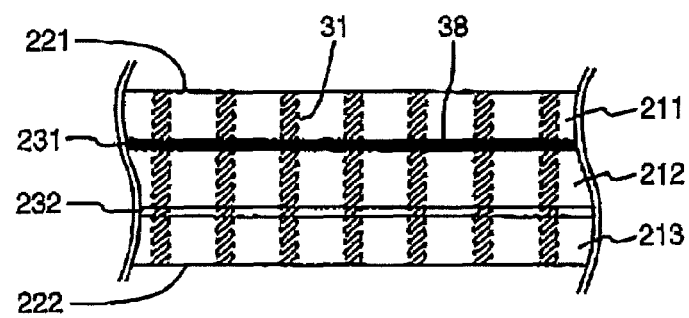
FIG. 11B
FIG. 12A  FIG. 12B  FIG. 12C
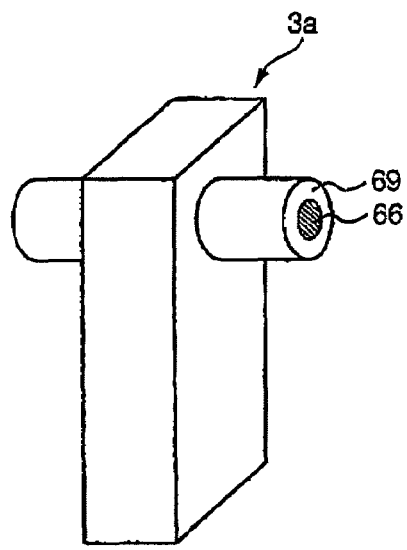
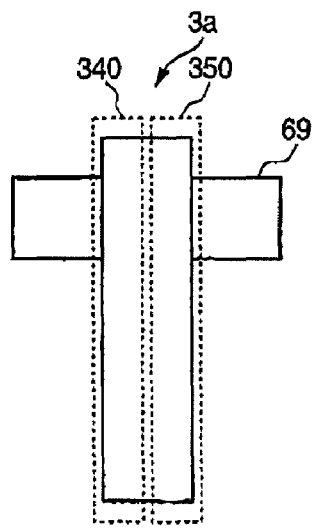
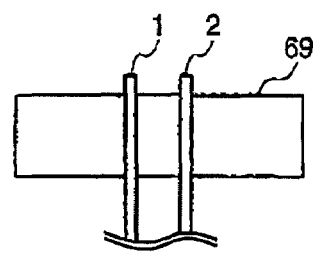

*FIG. 21*
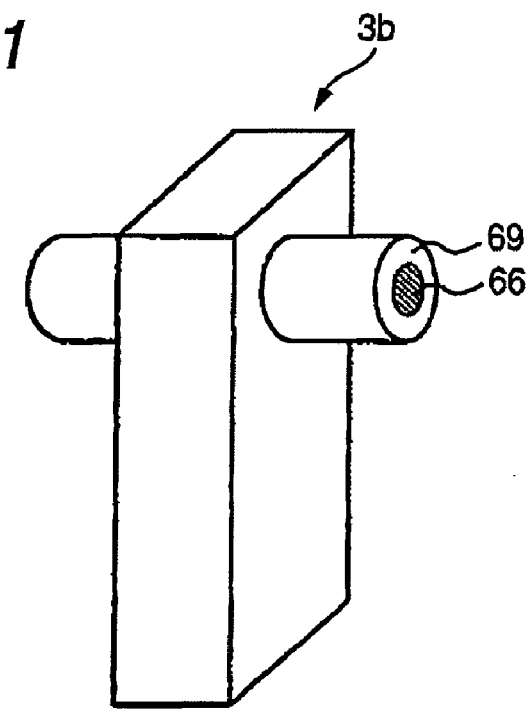
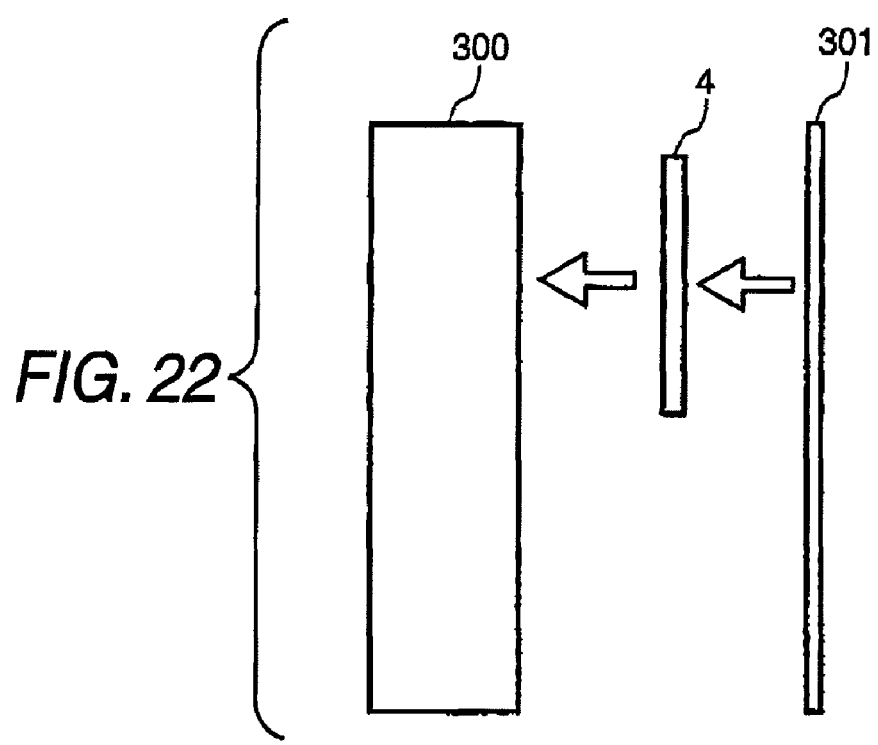
*FIG. 22*

CURRENT/VOLTAGE DETECTION PRINTED BOARD AND CURRENT/VOLTAGE DETECTOR

BACKGROUND OF THE INVENTION

1. Technical Field of the Invention

The present invention relates to a printed board having a shield portion, and in particular, to a current/voltage detection printed board that is used to detect an alternating current (AC) voltage generated at a power transmission conductor used as an alternating current power transmission path and an alternating current flowing in the power transmission conductor, and to a current/voltage detector using the current/voltage detection printed board.

2. Description of the Related Art

Like an impedance matching device or a high-frequency power supply device, there is known a device that detects AC power current and voltage and performs a control using the detected current and voltage. As an example, an impedance matching device will now be described.

FIG. 35 is a block diagram of an example of a high-frequency power supply system that uses an impedance matching device.

The high-frequency power supply system is a system that performs a processing, such as plasma etching or plasma CVD, on a workpiece, such as a semiconductor wafer or a liquid crystal substrate. The high-frequency power supply system includes a high-frequency power supply device 61, a transmission line 62, an impedance matching device 63, a load connection portion 64, and a load 65 (plasma processing device 65).

The high-frequency power supply device 61 is a device that outputs high-frequency power to the plasma processing device 65 as a load. Moreover, high-frequency power output from the high-frequency power supply device 61 is supplied to the plasma processing device 65 through the transmission line 62 having a coaxial cable, the impedance matching device 63, and the load connection portion 64 having a shielded copper plate. In general, the high-frequency power supply device 61 outputs high-frequency power having a frequency of a radio frequency band (for example, a frequency of hundreds kHz or more, and just about less than 1 GHz although not strictly-set the upper limit).

The plasma processing device 65 is a device that performs a processing (etching or CVD) on a wafer or a liquid crystal substrate.

The impedance matching device 63 includes a matching circuit that has a variable impedance element (for example, a variable capacitor, a variable inductor, or the like) (not shown) therein. The impedance matching device 63 has a control function of changing impedance of the variable impedance element in the matching circuit to accomplish impedance matching between the high-frequency power supply device 61 and the load 65.

In order to perform the above-described control, a current detector and a voltage detector are provided between an input terminal 63a of the impedance matching device 63 and the matching circuit. The current detector and the voltage detector detect high-frequency current and high-frequency voltage output from the high-frequency power supply device 61. Information of forward wave power or reflected wave power is obtained using the current and voltage detected by the detectors. Then, impedance of the variable impedance element is controlled using the obtained information to accomplish impedance matching.

FIG. 36 is a schematic circuit diagram of a current detector 80 and a voltage detector 90 provided between the input terminal and a matching circuit 67 of the impedance matching device 63. As shown in FIG. 36, a power transmission conductor 66 (for example, rod-shaped copper) serving as a power transmission path is provided between the input terminal 63a and the matching circuit 67. Then, the current detector 80 and the voltage detector 90 are provided on the power transmission conductor 66.

The current detector 80 has a current transformer 81, output wires 82 and 83 of the current transformer 81, a current conversion circuit 84, and an output wire 85 of the current conversion circuit 84. In the current detector 80, a current according to an AC current that flows in the power transmission conductor 66 flows in the current transformer 81. This current is input to the current conversion circuit 84 through the output wires 82 and 83 and is converted into a predetermined voltage level. Then, the converted voltage is output from the output wire 85 of the current conversion circuit 84.

The voltage detector 90 has a capacitor 91, an output wire 92 of the capacitor 91, a voltage conversion circuit 93, and an output wire 94 of the voltage conversion circuit 93. In the voltage detector 90, a voltage according to an AC voltage generated in the power transmission conductor 66 is generated in the capacitor 91. This voltage is input to the voltage conversion circuit 93 through the output wire 92 and is converted into a predetermined voltage level. Then, the converted voltage is output from the output wire 94 of the voltage conversion circuit 93.

Subsequently, as described above, the information of forward wave power or reflected wave power is obtained using the current and voltage detected by the current detector 80 and the voltage detector 90. The current detector 80 and the voltage detector 90 have a structure shown in FIGS. 28 and 29.

FIG. 37 is a schematic exterior view of the current detector 80 and the voltage detector 90.

FIGS. 38A to 38C are explanatory views illustrating the configuration of the current detector 80 and the voltage detector 90 shown in FIG. 37. Specifically, FIG. 38A is a diagram showing the interior of a casing (indicated by a dotted line) of FIG. 27 in perspective view. FIG. 38B is a diagram showing the vicinity of the current transformer 81 as viewed from the transverse side of FIG. 38A. FIG. 38C is a diagram showing the vicinity of the capacitor 91 as viewed from the transverse side of FIG. 38A.

In FIGS. 37 and 38A to 38C, the power transmission conductor 66 and an insulator 69 covering the power transmission conductor 66, not included in the current detector 80 and the voltage detector 90, are shown for explanation. Further, in FIGS. 37 and 38A to 38C, for convenience, the same parts as those in FIG. 36 are represented by the same reference numerals.

Hereinafter, the current detector 80 and the voltage detector 90 will be described with reference to FIGS. 37 and 38A to 38C.

In FIGS. 37 and 38A to 38C, the power transmission conductor 66 is, for example, a cylindrical copper rod. The periphery of the power transmission conductor 66 is covered with a hollow insulator 69. Then, the power transmission conductor 66 and the insulator 69 pass through a casing 71. Further, the current transformer 81 constituting the current detector 80 and the capacitor 91 constituting the voltage detector 90 are accommodated in the casing 71.

In the current transformer 81, a coated copper wire or the like is wound around a ring-shaped magnetic core (for example, a toroidal core made of ferrite) to form a coiled wire. Then, the current transformer 81 is disposed such that the power transmission conductor 66 passes through the magnetic core. Accordingly, a current according to a current flowing in the power transmission conductor 66 flows in the coiled wire of the current transformer 81.

The current flowing in the current transformer 81 is input to the current conversion circuit 84 through the output wires 82 and 83 that are connected to both ends of the coiled wire. Then, the current conversion circuit 84 converts the input current into a predetermined voltage level and outputs the converted voltage.

The capacitor 91 is formed by providing a ring-shaped conductor 91b (for example, a copper ring) in the vicinity of the insulator 69. The ring-shaped conductor 91b and a portion 91a facing the power transmission conductor 66 function as electrodes of the capacitor. Accordingly, a voltage according to the voltage generated in the power transmission conductor 66 is generated in the capacitor 91. The voltage generated in the capacitor 91 is input to the voltage conversion circuit 93 through the output wire 92 connected to the ring-shaped conductor 91b. Then, the voltage conversion circuit 93 converts the input voltage into a predetermined voltage level and outputs the converted voltage.

Moreover, in FIGS. 37 and 38A to 38C, the output wire 85 of the current conversion circuit 84 and the output wire 94 of the voltage conversion circuit 93 are not shown. Further, in order to protect the current conversion circuit 84 and the voltage conversion circuit 93 from an influence of an electromagnetic wave, a common conductor cover 72 is provided to cover the current conversion circuit 84 and the voltage conversion circuit 93. FIG. 37 shows a state where the cover 72 is removed, in order to show the current conversion circuit 84 and the voltage conversion circuit 93. Further, in FIGS. 38A to 38C, the cover 72 is not shown.

As described with reference to FIGS. 37 and 38A to 38C, the current detector 80 and the voltage detector 90 have the casing that covers the current transformer 81, the capacitor 91, and the like, in addition to the parts of the circuit diagram in FIG. 38. The casing is common to the current detector 80 and the voltage detector 90 according to the related art.

The current detector 80 and the voltage detector 90 described above can be used to other devices, such as the high-frequency power supply device 61 or the like. For example, in case of the high-frequency power supply device, the current detector and the voltage detector are provided at an output terminal of the high-frequency power supply device 61. In this case, the current detector and the voltage detector are used to detect current and voltage required for controlling output forward wave power to have a set value.

The current detector and the voltage detector may detect current and voltage at the output terminal 63b of the impedance matching device or the input terminal of the load 65 and may be used to control or analyze the detected current or voltage.

FIG. 39 is a circuit diagram showing a case where the current detector 80 and the voltage detector 90 are provided between the matching circuit and the output terminal in the impedance matching device.

As shown in FIG. 39, the current detector 80 and the voltage detector 90 are provided on the power transmission conductor 68 between the matching circuit 67 and the output terminal 63b in the impedance matching device 63. In this case, the current detector 80 and the voltage detector 90 detect current and voltage at the output terminal 63b of the impedance matching device 63.

In FIG. 39, the same parts as those of the circuit diagram in FIG. 36 are represented by the same reference numerals. Meanwhile, there is a difference in current and voltage at the input terminal 63a and the output terminal 63b of the impedance matching device 63. Accordingly, the current detector 80 and the voltage detector 90 have a structural difference in view of current resistance and voltage resistance. In FIG. 39, the same reference numerals are used regardless of the structural difference. For example, the output terminal 63b of the impedance matching device 63 has higher current and voltage than the input terminal 63a thereof. For this reason, when the current detector 80 and the voltage detector 90 are provided at the output terminal 63b of the impedance matching device 63, it is necessary to extend an insulation length, compared with a case where the current detector 80 and the voltage detector 90 are provided at the input terminal 63a of the impedance matching device 63. In order to extend the insulation length, a conductor having a large diameter is used as the power transmission conductor 68 or the insulator 69 covering the periphery of the power transmission conductor 68 has a large thickness. In FIG. 39, however, for convenience, the structural difference is not considered.

As shown in FIG. 39, when the current detector and the voltage detector are used in the impedance matching device 63, it is necessary to additionally provide a detector for detecting information of current and voltage for impedance matching on the input side of the impedance matching device 63.

Besides, the above examples are disclosed by, for example, JP-A-2003-302431 and JP-A-2004-85446.

Since the current transformer 81 constituting the current detector 80 is formed by winding the wire around the magnetic core, a variation in wiring interval or wiring strength may easily occur. For this reason, when a plurality of current detectors 80 are formed, a variation in detection value of the individual current detectors 80 may easily occur.

Further, a variation in shape of the output wires 82 and 83 of the current transformer 81 may easily occur, which may cause a variation in current detection value.

The inner diameter of the ring-shaped conductor 91b constituting the voltage detector 90 is substantially consistent with the outer diameter of the insulator 69 covering the periphery of the power transmission conductor 66. The ring-shaped conductor 91b is fitted into the insulator 69. That is, the ring-shaped conductor 91b is positioned by the insulator 69. However, the insulator 69 may be thinned due to a secular change or the like. In this case, the position of the ring-shaped conductor 91b may be unstable, and a gap may occur between the power transmission conductor 66 and the insulator 69. In this state, if an external force acts on the power transmission conductor 66, the positional relationship between the power transmission conductor 66 and the ring-shaped conductor 91b changes. Then, a voltage detection value changes from an initial state (upon adjustment of the detector). Besides, since the position of the ring-shaped conductor 91b is unstable, when a plurality of voltage detectors 90 are formed, a variation in detection value of the individual voltage detectors 90 may easily occur.

Further, a variation in shape of the output wire 92 of the ring-shaped conductor 91b may easily occur, which may cause a variation in voltage detection value.

That is, in case of the current detector 80 or the voltage detector 90, when a plurality of detectors are formed, a variation in detection value of the individual detectors may easily occur.

Further, since the wire is wound around the core in the current transformer 81 constituting the current detector 80, there is a self-resonant frequency by self inductance and line capacitance. However, since relative magnetic permeability of a magnetic material used for the core is large, the self-resonant frequency becomes low. For this reason, an upper limit of a detectable frequency band becomes low. That is, the detectable frequency band is limited.

The current detection point and the voltage detection point are preferably the same, but as shown in FIGS. 38A to 38C, the current detection point and the voltage detection point may be away from each other in the axial direction of the power transmission conductor 66.

SUMMARY OF THE INVENTION

The invention has been finalized in consideration of the above problems, and an object of the invention is to provide a current/voltage detection printed board that can approximate a current detection point and a voltage detection point, and a current/voltage detector using the printed board. Another object of the invention is to provide a current/voltage detector that can reduce a variation in a detection value, even if a plurality of detectors are formed.

According to a first aspect of the invention, there is provided a printed board, including: a first shield portion, configured to reduce an influence of an electric field in combination with a casing accommodating the printed board, at least a part of the first shield portion being formed with a plurality of through holes; and a second shield portion, configured to reduce the influence of the electric field in combination with the casing, at least a part of the second shield portion being formed with a plurality of through holes, wherein the second shield portion is arranged alongside of the first shield portion.

According to a second aspect of the invention, each of the first shield portion and the second shield portion includes an unshielded portion.

According to a third aspect of the invention, no unshielded portion is provided with respect to the first shield portion and the second shield portion.

According to a fourth aspect of the invention, a printed board, configured to detect an AC current flowing in a power transmission conductor and an AC voltage generated in the power transmission conductor, the power transmission conductor being used as an AC power transmission path, the printed board including: a first wire, configured to detect the AC voltage; a shield portion, configured to reduce an influence of an electric field of the AC current in combination with a casing accommodating the printed board, at least a part of the shield portion being formed with a plurality of through holes; and a second wire, configured to detect the AC current, wherein: the printed board is formed with a penetration hole; the first wire is provided between the penetration hole and the shield portion; and the shield portion is provided between the first wire and the second wire.

According to a fifth aspect of the invention, the through holes are arranged in a substantially circular shape.

According to a sixth aspect of the invention, the through holes are arranged in a substantially circular shape and in at least two lines.

According to a seventh aspect of the invention, there is provided a detector, configured to detect an AC current flowing in a power transmission conductor and an AC voltage generated in the power transmission conductor, the power transmission conductor being used as an AC power transmission path, the detector including: a casing; and a printed board including: a first wire, configured to detect the AC voltage; a shield portion, configured to reduce an influence of an electric field of the AC current in combination with the casing accommodating the printed board, at least a part of the shield portion being formed with a plurality of through holes; and a second wire, configured to detect the AC current, wherein: the printed board is formed with a penetration hole; the first wire is provided between the penetration hole and the shield portion; the shield portion is provided between the first wire and the second wire; and the casing covers the printed board excluding the penetration hole.

According to an eighth aspect of the invention, the through holes are arranged in a substantially circular shape.

According to a ninth aspect of the invention, the through holes are arranged in a substantially circular shape and in at least two lines.

According to a tenth aspect of the invention, the shield portion includes an unshielded portion where the influence of the electric field is not reduced.

According to an eleventh aspect of the invention, the unshielded portion is provided between a first surface and a second surface of the printed board.

According to a twelfth aspect of the invention, the unshielded portion is provided between the printed board and the casing.

According to a thirteenth aspect of the invention, the casing includes: a main body, configured to fix the print board; and a cover portion, configured to accommodate the print board.

According to a fourteenth aspect of the invention, the print board includes a plurality of layers laminated each other; the first wire is formed with a plurality of through holes arranged along the periphery of the penetration hole, the through holes penetrating between a part of the layers; and the first wire includes a pattern wire connecting the through holes.

According to a fifteenth aspect of the invention, the AC current has a frequency of a radio frequency band.

The second wire may include at least one wire that is formed in a coiled shape having both ends by penetrating between a top conductive layer and a bottom conductive layer of the board and alternately connecting the top conductive layer and the bottom conductive layer of the board or/and at least one wire that is formed in a coiled shape having both ends by penetrating a part of layers of the board and alternately connecting the top conductive layer and the bottom conductive layer of the penetrating portion.

The second wire may include through holes formed at the penetrating portion penetrating between the top conductive layer and the bottom conductive layer of the board or the part of layers of the board, and pattern wires formed on the top conductive layer and the bottom conductive layer of the penetrating portion.

When a plurality of second wires are formed in the board, both ends or electrically identical portions of each second wire may be electrically connectable to both ends or electrically identical portions of another second wire.

The penetration hole may have a circular shape, the first wire may be substantially formed in a circular shape along the periphery of the penetration hole, and the second wire may be substantially formed in a circular shape.

The through holes can be easily formed in manufacturing the printed board. Therefore, according to the aspects of the invention, the shield portion can be easily formed in the printed board.

Like the fourth aspect of the invention, since a voltage detection portion and a current detection portion are provided in the same board, the voltage detection point and the current detection point can be substantially the same.

Like the fourth and seventh aspects of the invention, when the shield portion formed by the through holes is used, even if the voltage detection portion and the current detection portion are provided in the same board, an influence of an electric field on the current detection portion can be reduced, and a magnetic flux required for current detection can act on the current detection portion.

BRIEF DESCRIPTION OF THE DRAWINGS

Embodiment may be described in detail with reference to the accompanying drawings, in which:

FIGS. 11A and 11B show another example of a ring-shaped wire 30;

FIGS. 12A to 12C are schematic exterior views of a current/voltage detector 3a according to the invention;

FIG. 21 is a schematic exterior view three-dimensionally showing a current/voltage detector 3b according to the invention;

FIG. 22 is a diagram showing the schematic configuration of the current/voltage detector 3b shown in FIG. 21;

DETAILED DESCRIPTION OF THE INVENTION

Hereinafter, the details of the invention will be described with reference to the drawings.

(1) Current Detection Printed Board

Figure 1A:
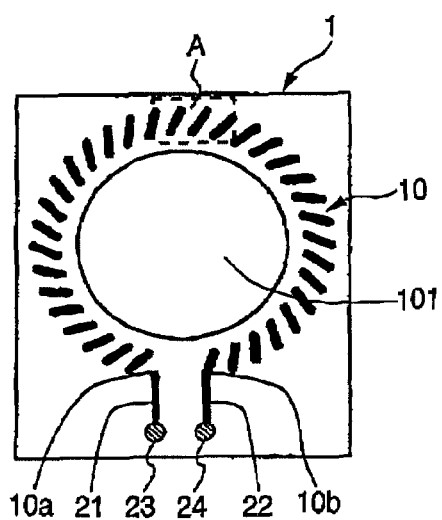
FIGS. 1A to 1D are diagrams showing an example of a current detection printed board 1 according to the invention.
Figure 1B:
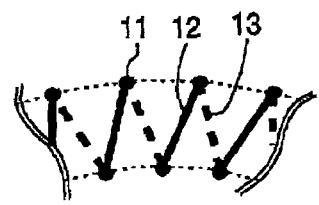
Figure 1C:
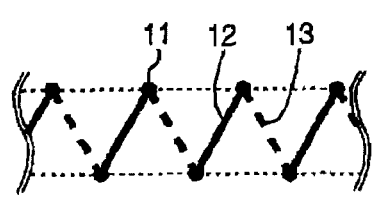
Figure 1D:
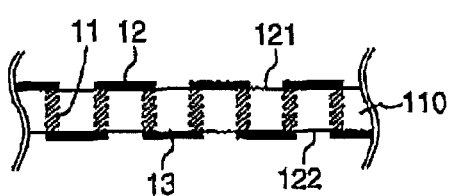

FIGS. 1A to 1D are diagrams showing an example of a current detection printed board 1 according to the invention. Specifically, FIG. 1A is a plan view of the current detection printed board 1 (as viewed from the above) FIG. 1B is a schematic view of a portion (a portion A surrounded by a dotted line) of FIG. 1A on magnified scale. FIG. 1C is a diagram showing linear expansion for simplification of FIG. 1B. FIG. 1D shows a wire of the current detection printed board 1 when FIG. 1C is viewed from the side. Moreover, as regards the wire shown in FIG. 1D, portions that are not typically viewed are shown in perspective view for explanation.

As shown in FIGS. 1A to 1D, the current detection printed board 1 is provided with a penetration hole 101 that penetrates a board. A wire 10 (hereinafter, referred to as a coiled wire 10) that is formed in a coiled shape is provided along the periphery of the penetration hole 101. The coiled wire 10 is formed in a coiled shape having both ends by alternately connecting a front surface 121 and a rear surface 122 of the board while penetrating the board. Portions of the wire penetrating the board are formed by through holes 11 and wires of the front surface and the rear surface of the board are formed by pattern wires 12 and 13.

Moreover, in FIGS. 1B and 1C, portions indicated by dotted lines represent pattern wires of the rear surface of the board. These portions are in perspective view, and thus indicated by dotted lines. Output wires 21 and 22 are connected to both ends 10a and 10b of the coiled wire 10. The output wires are connected to output terminals 23 and 24.

In this example, the board having a double-sided structure (hereinafter, referred to a double-sided board) is used. Accordingly, the pattern wires are formed on a front surface layer and a rear surface layer of one insulator member 110.

The coiled wire 10 is an example of a coiled first wire of the invention, and the output wires 21 and 22 are examples of the second wire of the invention.

Figure 2:
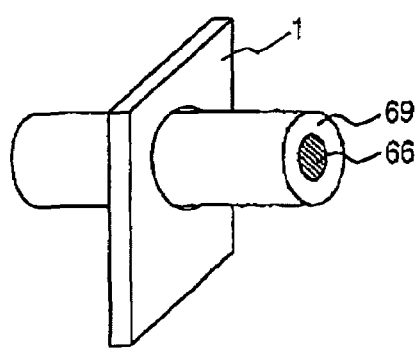
FIG. 2 is a diagram showing a case where a power transmission conductor 66, in which an AC current flows, and an insulator 69 covering the power transmission conductor 66 are disposed to pass through a penetration hole 101 provided in the current detection printed board 1.

FIG. 2 is a diagram showing a case where a power transmission conductor 66, in which an AC current flows, and an insulator 69 covering the power transmission conductor 66 are disposed to pass through the penetration hole 101 provided in the current detection printed board 1. Moreover, for simplification, the wire is not shown. Further, in this embodiment and the following embodiments, a case where the current detection printed board or a voltage detection printed board described below is provided between an input terminal and a matching circuit 67 of an impedance matching device 63.

In case of the current detection printed board 1 shown in FIG. 1, as shown in FIG. 2, when the power transmission conductor 66, in which an AC current flows, is disposed to pass through the penetration hole 101, a current flows in the coiled wire 10 by electromagnetic induction. That is, the printed board can have a current transformer. Specifically, a current transformer can be formed in the current detection printed board 1.

Figure 36:
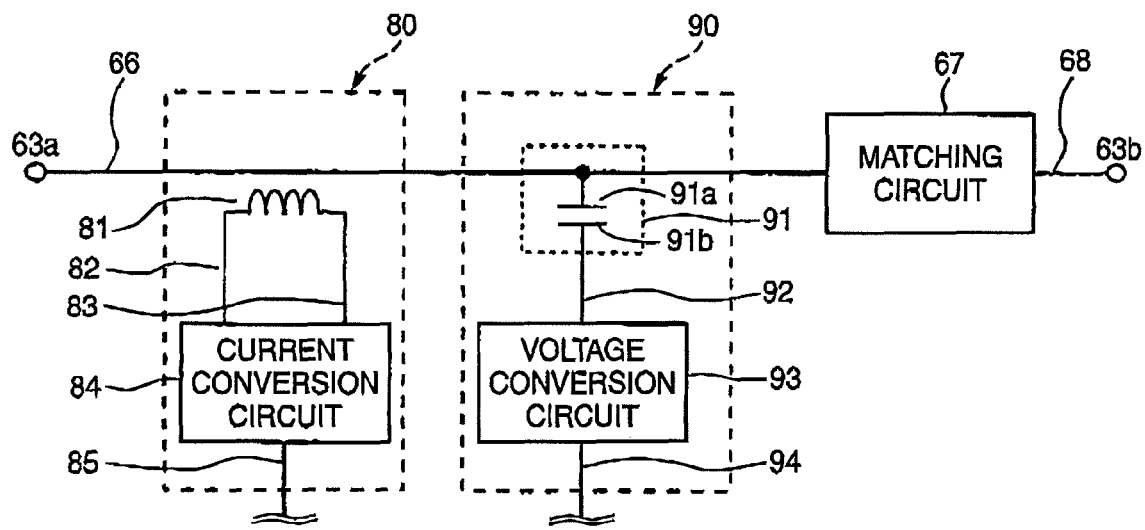
FIG. 36 is a schematic circuit diagram of a current detector 80 and a voltage detector 90 provided between an input terminal and a matching circuit 67 of an impedance matching device 63.
Figure 37:
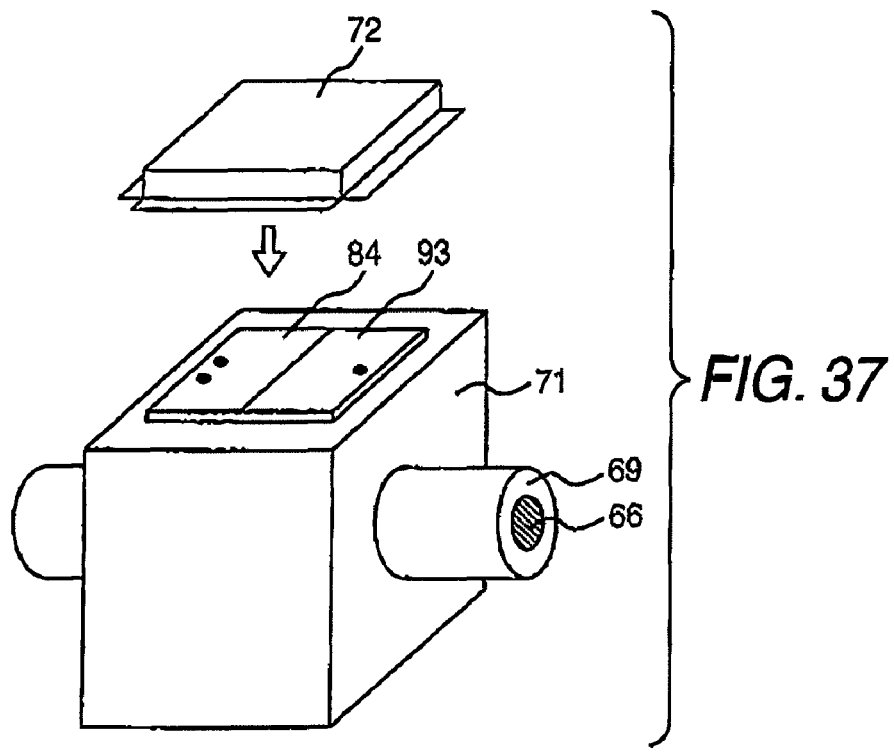
FIG. 37 is a schematic exterior view of the current detector 80 and the voltage detector 90.
Figure 38A:
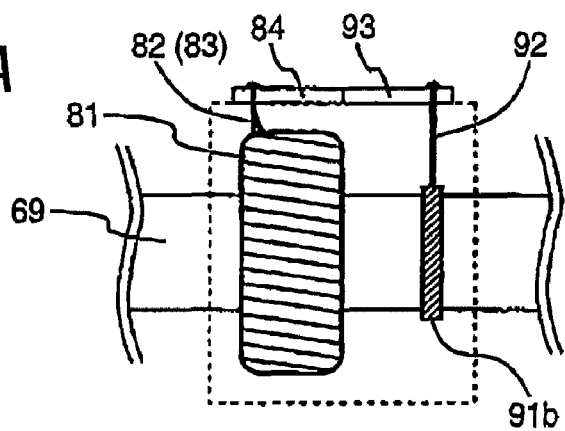
FIGS. 38A to 38C are explanatory views illustrating the configuration of the current detector 80 and the voltage detector 90 shown in FIG. 37.
Figure 38B:
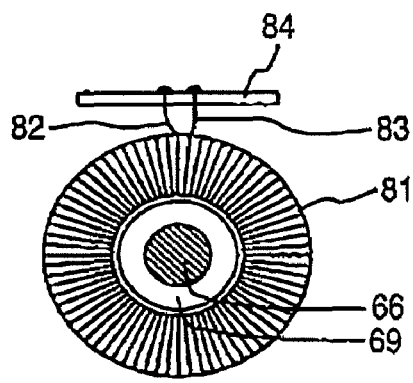
Figure 38C:
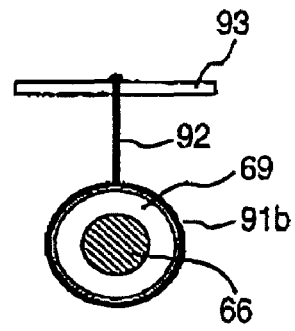
Figure 39:
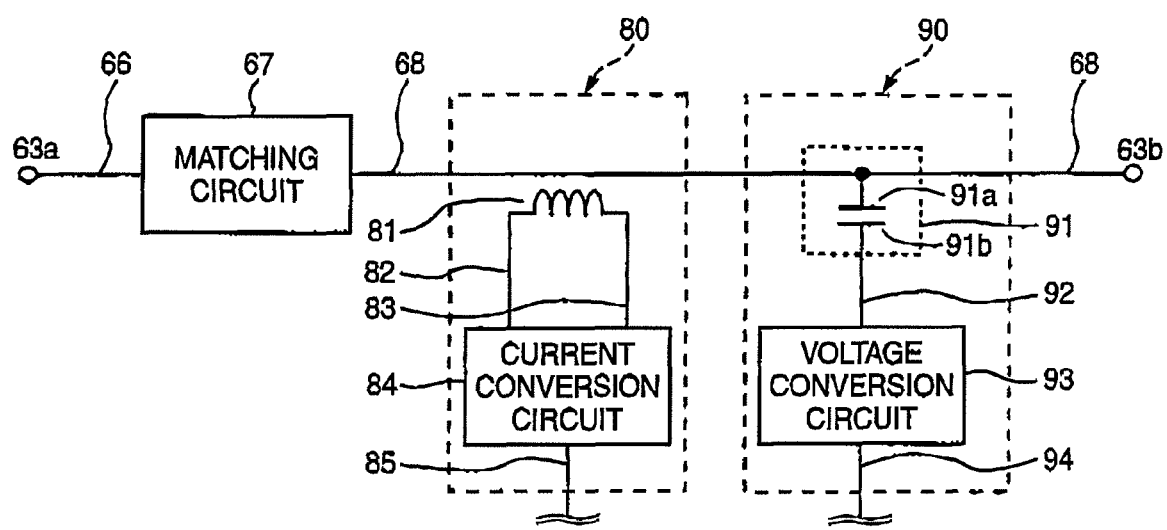
FIG. 39 is a circuit diagram showing a case where the current detector 80 and the voltage detector 90 are provided between the matching circuit and the output terminal in the impedance matching device.

Accordingly, the portions of the coiled wire 10 correspond to the current transformer 81 in the circuit diagram shown in FIG. 36.

With this configuration, the portions of the coiled wire 10 are formed by the through holes and the pattern wires, and thus there is almost no variation in shape or position. Accordingly, there is almost no variation in winding interval or winding strength. Therefore, when a plurality of current detection printed boards 1 are formed, a variation in current detection value of the individual current detection printed boards 1 can be reduced.

In particular, if AC power to be transmitted through the power transmission conductor 66 is AC power having a frequency of a radio frequency band, a variation in winding interval or winding strength of the current detection printed board 1 may have a large effect on the current detection value. However, according to the current detection printed board 1 having the above configuration, even though AC power having a frequency of a radio frequency band is adopted, an influence thereof can be suppressed to the minimum.

As described below, a current conversion circuit 51 corresponding to the current conversion circuit 84 shown in FIG. 36 may be provided on the current detection printed board 1 of FIG. 1. In this case, the output terminals 23 and 24 shown in FIG. 1 are not required, and the output wires 21 and 22 of the coiled wire 10 are directly connected to the current conversion circuit 51.

The insulator member 110 of the board is formed of, for example, glass epoxy. Relative magnetic permeability of the insulator member 110 of the board is smaller than a magnetic material. For this reason, a self-resonant frequency may be higher, compared with a case where a current transformer is formed by winding a wire around a magnetic material uses as a core, like the related art. Accordingly, an upper limit of a detectable frequency band is higher than the related art.

FIGS. 3A to 3E are diagrams showing another example of the current detection printed board 1 according to the invention.

Figure 3A:
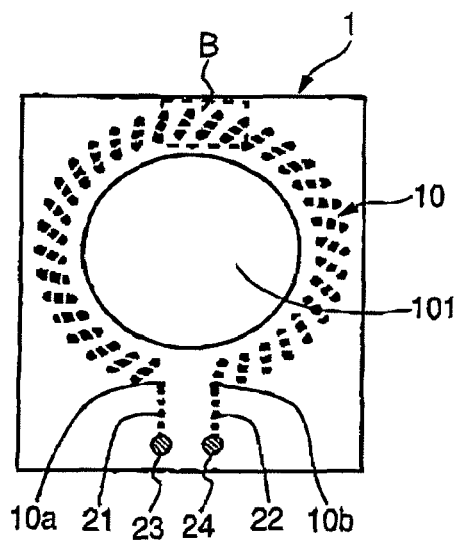
FIGS. 3A to 3E are diagrams showing another example of the current detection printed board 1 according to the invention.
Figure 3B:
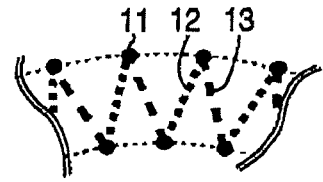
Figure 3C:
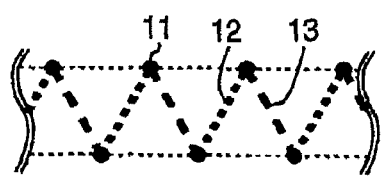
Figure 3D:
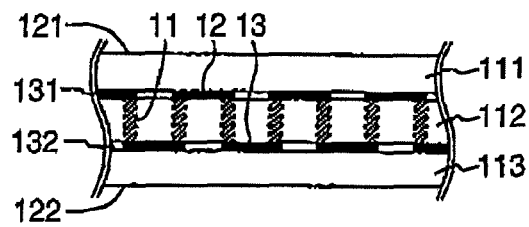
Figure 3E:
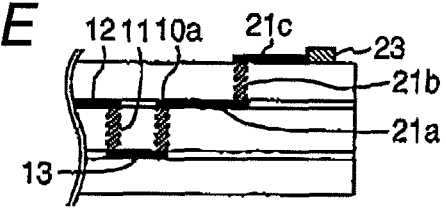

Specifically, FIG. 3A is a plan view of the current detection printed board 1. FIG. 3B is a schematic view of a portion (a portion B surrounded by a dotted line) of FIG. 3A on magnified scale. FIG. 3C is a diagram showing linear expansion for simplification of FIG. 3B. FIG. 3D shows a wire of the current detection printed board 1 when FIG. 3C is viewed from the side. FIG. 3E shows the wire of the current detection printed board 1 paying emphasis on the output wire 21 as viewed from the side. Moreover, as regards the wire shown in FIGS. 3A to 3E, portions that are not typically viewed are shown in perspective view for explanation. In addition, for convenience, the current detection printed board 1, through holes 11, pattern wires 12 and 13, and the like are represented by the same reference numerals as those in FIGS. 1A to 1D.

The current detection printed board 1 shown in FIGS. 3A to 3E is specifically the same as the current detection printed board 1 shown in FIGS. 1A to 1D, except that the board has a multilayer structure, and the coiled wire 10 is formed between inner layers.

Moreover, in this specification, insulator materials constituting the board having a multilayer structure (hereinafter, referred to as a multilayer board) are appropriately called a first insulator material, a second insulator material, a third insulator material, . . . in sequence from the upper portion of the drawings. Further, conductive layers to be formed between the individual insulator materials of the board are appropriately called a first conductive layer, a second conductive layer, a third conductive layer, . . . . Further, a conductive layer to be formed at the front surface of the board is called a front surface layer, and a conductive layer to be formed at the rear surface of the board is called a rear surface layer.

Moreover, although the double-sided board has the front surface layer and the rear surface layer and may be called a multilayer board, since only one insulator material exists, there are no conductive layers to be formed between the individual insulator materials of the board.

In the example of FIGS. 3A to 3E, the insulator materials of the board include three insulator materials of a first insulator material 111, a second insulator 112, and a third insulator material 113. Then, a first conductive layer 131 is formed between the first insulator material 111 and the second insulator material 112, and a second conductive layer 132 is formed between the second insulator material 112 and the third insulator material 113. Further, a front surface layer can be formed on a front surface 121 (a surface on the first insulator material) of the board. In addition, a rear surface layer can be formed on a rear surface 122 (a lower surface of the third insulator material) In the example of FIGS. 3A to 3E, the rear surface layer of the board is not provided.

For this reason, in FIGS. 3A to 3E, the coiled wire 10 is formed between the first conductive layer 131 and the second conductive layer 132. Accordingly, the coiled wire 10 can have a structure that cannot be viewed from the outside of the board. In this case, portions of the coiled wire 10 correspond to the current transformer 81 of the circuit diagram shown in FIG. 27.

Further, as shown in FIG. 3E, the output wire 21 of the coiled wire 10 is formed by a pattern wire 21a connected to one end 10a of the coiled wire 10 formed in the first conductive layer 131, a through hole 21b, and a pattern wire 21C formed on the front surface of the board. The output wire 21 is connected to the output terminal 23. The output wire 22 of the coiled wire 10 is the same as the output wire 21, and thus the description thereof will be omitted.

Moreover, as described below, the current conversion circuit 51 corresponding to the current conversion circuit 84 shown in FIG. 36 may be formed on the current detection printed board 1 of FIGS. 3A to 3E. In this case, the output terminals 23 and 24 shown in FIGS. 3A to 3E are not required, and thus the output wires 21 and 22 of the coiled wire 10 are directly connected to the current conversion circuit 51.

Figure 4A:
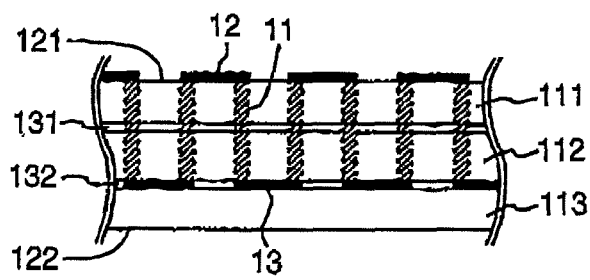
FIGS. 4A and 4B are diagrams showing another example of a coiled wire 10.
Figure 4B:
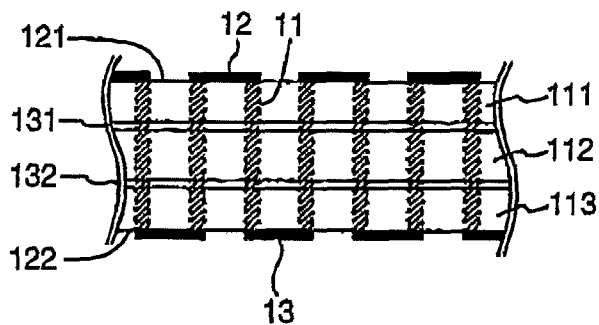

FIGS. 4A and 4B are diagram showing another example of the coiled wire 10. For example, as shown in FIG. 4A, the coiled wire 10 may be formed between the front surface layer of the board and the second conductive layer 132. Moreover, in FIG. 4A, since the rear surface layer is not provided on the rear surface 122 of the board, the coiled wire 10 is formed by alternately connecting the front surface layer as a top conductive layer of the board and the second conductive layer 132 as a bottom conductive layer of the board.

Further, as shown in FIG. 4B, the coiled wire 10 may be formed between the front surface layer as a top conductive layer and the rear surface layer as a bottom conductive layer of the board. Moreover, in FIG. 4B, like FIGS. 1A to 1D, the coiled wire 10 is formed by alternately connecting the front surface layer and the rear surface layer of the board.

In general, a through hole is one for connection between layers by forming a penetration hole between the layers of the board and providing a conductive layer (for example, copper) in the penetration hole. Moreover, the term 'between the layers' may mean 'between all layers' or 'between some layers'.

The through hole is a type of inserting a lead line. However, the through hole only for connection between the layers is particularly called a via hole. Then, the via hole includes a penetration via hole that forms a penetration hole from the front surface of the board to the rear surface thereof, and an interstitial via hole that forms a penetration hole only between specific layers. Further, the interstitial via hole includes a blind via in which a hole is viewed from one surface of the board, as shown in FIG. 4A, and a buried via in which a hole is not viewed from both surfaces of the board, as shown in FIGS. 3A to 3E.

The example shown in FIGS. 3A to 3E and 4 uses a so-called four-layered board (four conductive layers including the front surface layer and the rear surface layer), but is not intended to limit the invention. For example, a multilayer board, such as a three-layered board, a six-layered board, or an eight-layered board, may be used.

Figures 5, 6:
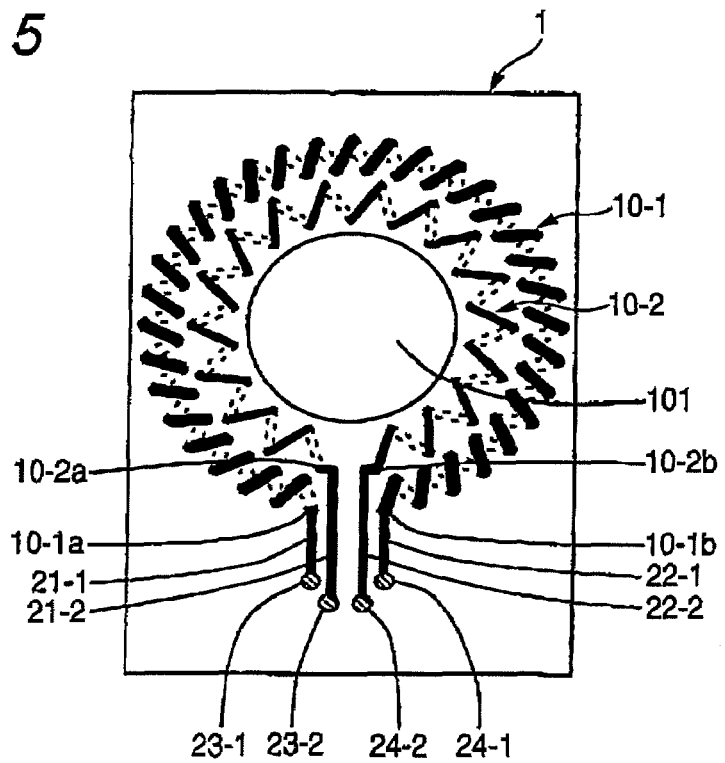
FIG. 5 is a diagram showing another example of the current detection printed board 1 according to the invention.
FIG. 6 is a connection diagram of the current detection printed board 1 shown in FIG. 5.

FIG. 5 is diagram showing another example of the current detection printed board 1 according to the invention. The current detection printed board 1 shown in FIG. 5 is different from that of FIG. 1 in that two coiled wires 10-1 and 10-2 are provided in the current detection printed board 1. Specifically, a first coiled wire 10-1 that is disposed near the outside of the current detection printed board 1 and a second coiled wire 10-2 that is disposed closer to the penetration hole 101 than the first coiled wire 10-1 does are provided in the current detection printed board 1. Further, the first coiled wire 10-1 and the second coiled wire 10-2 are formed by through holes and pattern wires, like FIGS. 1B and 1C. For this reason, the descriptions thereof will be omitted. Of course, the multilayer board shown in FIGS. 3A to 3E may be used. Here, the description thereof will be omitted.

As described above, in the current detection printed board 1 shown in FIG. 5, since the two coiled wires 10-1 and 10-2 are provided, various kinds of current transformers can be formed in one current detection printed board 1. This example will be described with reference to FIG. 6.

FIG. 6 is a connection diagram of the current detection printed board 1 shown in FIG. 5.

As shown in FIG. 5, output terminals 23-1 and 24-1 are connected to both ends 10-1a and 10-1b of the first coiled wire 10-1 via the output wires 21-1 and 22-1. Further, output terminals 23-2 and 24-2 are connected to both ends 10-2a and 10-2b of the second coiled wire 10-2 via the output wires 21-1 and 22-1. In this case, with the connection shown in FIG. 6, various kinds of current transformers can be formed in one current detection printed board 1. Moreover, in FIG. 6, '(' means non-connection to other terminals.

Specifically, in case of connection (a) in FIG. 6, a current transformer using the first coiled wire 10-1 is formed in the current detection printed board 1.

In case of connection (b) in FIG. 6, a current transformer using the second coiled wire 10-2 is formed in the current detection printed board 1.

In case of connection (c) in FIG. 6, if the output terminal 23-2 and the output terminal 24-1 are connected to each other, a current transformer when the first coiled wire 10-1 and the second coiled wire 10-2 are connected in series to each other is formed. Therefore, in this case, a current transformer having larger inductance can be formed, compared with the cases (a) and (b) in FIG. 6.

In addition, like connection (d) in FIG. 6, if the output terminal 23-1 and the output terminal 23-2 are connected to each other, and the output terminal 24-1 and the output terminal 24-1 are connected to each other, a current transformer when the first coiled wire 10-1 and the second coiled wire 10-2 are connected in parallel with each other.

In case of connection (a) in FIG. 6, the output wires 21-2 and 22-2 are not required. In case of connection (b) in FIG. 6, the output wires 21-1 and 22-1 are not required. For this reason, unnecessary output wires and output terminals may not be provided.

Figure 7:
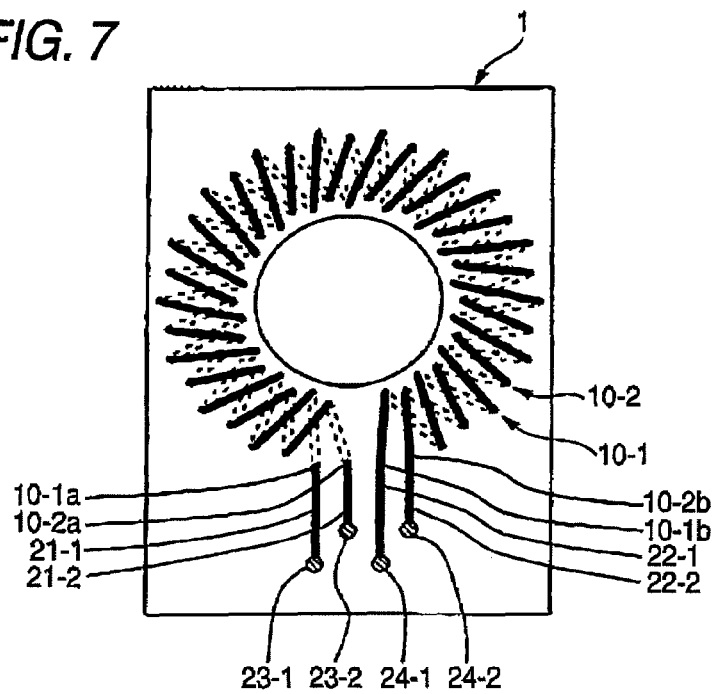
FIG. 7 is a diagram showing another example of the current detection printed board 1 according to the invention.

FIG. 7 is a diagram showing another example of the current detection printed board 1 according to the invention. In the current detection printed board 1, like FIG. 5, the first coiled wire 10-1 and the second coiled wire 10-2 are provided in one current detection printed board 1. The current detection printed board 1 of FIG. 7 is different from that of FIG. 5 in that the first coiled wire 10-1 and the second coiled wire 10-2 are disposed to have a double helix structure. Further, in FIG. 7, like FIG. 5, various kinds of current transformers can be formed in one current detection printed board 1. Moreover, in FIGS. 5 and 7, for ease discrimination of the wires, the positions of the output terminals are shifted from each other, but the invention is not limited thereto. Various kinds of position relationship may be adopted.

As shown in FIG. 7, the first coiled wire 10-1 and the second coiled wire 10-2 can be arranged to have a double helix structure. Alternatively, many arrangement examples may be considered, in addition to the example shown in FIG. 7.

Figure 8A:
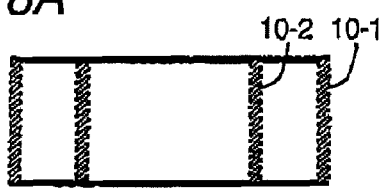
FIGS. 8A to 8E are diagrams the arrangement examples of a first coiled wire 10-1 and a second coiled wire 10-2.

FIGS. 8A to 8E are diagrams showing the arrangement examples of the first coiled wire 10-1 and the second coiled wire 10-2. FIGS. 8A to BE schematically show the sections of the first coiled wire 10-1 and the second coiled wire 10-2 and show various arrangement examples. Moreover, the first coiled wire 10-1 and the second coiled wire 10-2 are shifted from each other with respect to a backward direction as viewed from the paper. Since portions that are not typically viewed are shown in perspective view for explanation, the wires may seem to overlap each other.

For example, FIG. 8A shows an example where the first coiled wire 10-1 and the second coiled wire 10-2 are formed in the same conductive layer. In this case, the pattern wire of the first coiled wire 10-1 is longer than that of the second coiled wire 10-2. Of course, the pattern wire of the second coiled wire 10-2 may be longer than that of the first coiled wire 10-1.

Figure 8C:
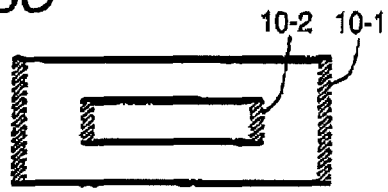
Figure 8B:
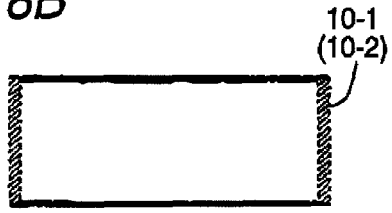

FIG. 8B shows an example where the first coiled wire 10-1 and the second coiled wire 10-2 are formed in the same conductive layer, like FIG. 8A. However, the pattern wires of the first coiled wire 10-1 and the second coiled wire 10-2 have the same length.

FIG. 8C shows an example where the through hole of the second coiled wire 10-2 is formed further towards the inside than the first coiled wire 10-1, and the pattern wire of the second coiled wire 10-2 is formed in a conductive layer inside the first coiled wire 10-1.

Figure 8D:
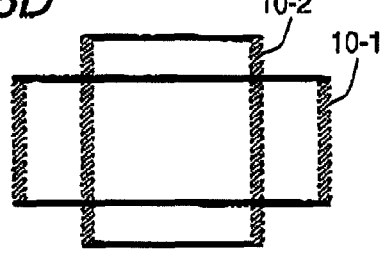

FIG. 8D shows an example where the through hole of the second coiled wire 10-2 is formed further towards the inside than the first coiled wire 10-1, and the pattern wire of the second coiled wire 10-2 is formed in a conductive layer outside the first coiled wire 10-1.

Figure 8E:
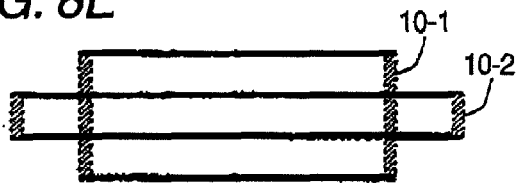

FIG. 8E shows an example where the through hole of the second coiled wire 10-2 is formed further towards the outside than the first coiled wire 10-1, and the pattern wire of the second coiled wire 10-2 is formed in a conductive layer inside the first coiled wire 10-1.

In addition, various modifications can be considered and easily considered from the above examples, and thus the descriptions thereof will be omitted. Moreover, as shown in FIGS. 8A and 8B, when the pattern wires of the first coiled wire 10-1 and the second coiled wire 10-2 are formed in the same conductive layer, a double-sided board can be used.

In FIGS. 8A to 8E, as the current detection printed board 1 is viewed in plan view, the through holes and the pattern wires of the first coiled wire 10-1 and the second coiled wire 10-2 are shifted from each other. With this configuration, various arrangement examples can be made. Alternatively, as shown in FIG. 8C, if the through hole of the second coiled wire 10-2 is formed further towards the inside than the through hole of the first coiled wire 10-1, and the pattern wire of the second coiled wire 10-2 is formed further towards the inside than the pattern wire of the first coiled wire 10-1, as viewed in plan view, the pattern wires of the first coiled wire 10-1 and the second coiled wire 10-2 may be partially overlap each other. Of course, the relationship between the first coiled wire 10-1 and the second coiled wire 10-2 may be reversed.

In FIGS. 5 and 7, an example where the two coiled wires 10 are provided in one current detection printed board 1 has been illustrated, but the number of coiled wires is not limited thereto. For example, three or more coiled wires 10 may be provided in one current detection printed board 1. Of course, with this configuration, the number of combinations of the coiled wires 10 to be formed in one current detection printed board 1 can be increased. Further, as described below, when the current conversion circuit 51 is provided on the current detection printed board 1, the same can be applied. In this case, as described above, the wires may be connected near both ends of the coiled wires 10 or may be connected in the current conversion circuit 51. That is, both ends of each wire or positions electrically identical to both ends thereof are electrically connectable to both ends of another wire or positions electrically identical to both ends thereof.

Next, the effects of a case where a plurality of coiled wires 10 are provided in the current detection printed board 1, as shown in FIGS. 5 and 7, will be described.

In general, a coil (also referred to as an inductor) has a frequency characteristic, and the characteristic changes according to a frequency to be used specifically, a detection level of a current is low in a region where a frequency is low. For this reason, the coil is used in a region where a frequency is high. However, an excessively high frequency causes resonance. A frequency at the time of resonance is referred to as a resonant frequency. Near the resonant frequency, a change in detection level of a current is excessively large, and thus it is unsuitable for current detection. For this reason, schematically, a detectable frequency band is limited. That is, a usable frequency has an upper limit and a lower limit.

If inductance of the coil becomes large, the detectable frequency band goes toward a lower frequency. Meanwhile, if inductance of the coil becomes small, the detectable frequency band goes toward a higher frequency. For this reason, it is necessary to select inductance of the coiled wire 10 to an appropriate value using a frequency of an AC current flowing in the power transmission conductor 66.

The above-described high-frequency power supply device 61 outputs different frequencies of high-frequency power according to the uses. For example, a frequency of 2 MHz, 13.56 MHz, or the like is used according to the uses. For this reason, since it is necessary to select inductance of the coiled wire 10 according to the frequencies. Accordingly, if various kinds of current transformers can be formed in one current detection printed board 1, convenience can be increased. For example, if both the current transformer for 2 MHz and the current transformer for 13.56 MHz can be formed, it is unnecessary to prepare the current detection printed boards 1 for the individual frequencies. Therefore, kinds of products can be reduced.

Like the examples shown in FIGS. 1A to 1D and FIGS. 3A to 3E, when the coiled wire 10 is a simplex wound wire, there is a limit to increase the number of turns. Then, there is also a limit to increase inductance. Here, in case of serial connection indicated by (c) of FIG. 6, inductance of the coiled wire 10 can be increased, and thus the detectable frequency band can be made low.

(2) Voltage Detection Printed Board

FIGS. 9A to 9D are diagrams showing an example of a voltage detection printed board 2 according to the invention.

Figure 9A:
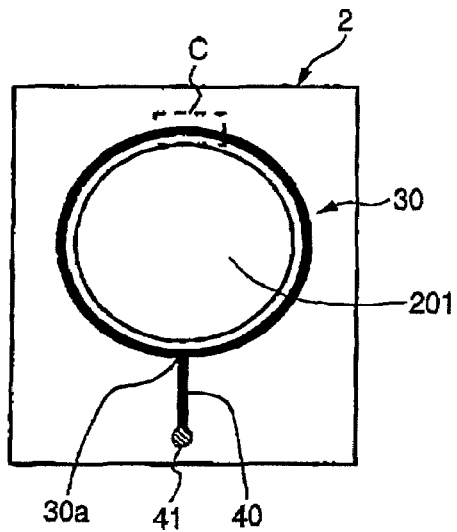
FIGS. 9A to 9D are diagram showing an example of a voltage detection printed board 2 according to the invention.
Figure 9B:
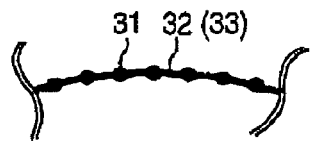
Figure 9C:
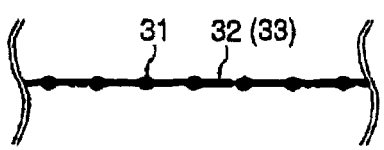
Figure 9D:
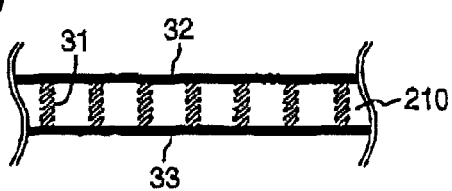

Specifically, FIG. 9A is a plan view of the voltage detection printed board 2. FIG. 9B is a schematic view of a portion (a portion C surrounded by a dotted line) of FIG. 9A on magnified scale. FIG. 9C is a diagram showing linear expansion for simplification of FIG. 9B. FIG. 9D shows a wire of the voltage detection printed board 2 when FIG. 9C is viewed from the side. Moreover, as regards the wire shown in FIG. 9D, portions that are not typically viewed are shown in perspective view for explanation.

As shown in FIGS. 9A to 9D, the voltage detection printed board 2 has a penetration hole 201 that penetrates a board, and a ring-shaped wire 30 that is provided at the periphery of the penetration hole 201. The ring-shaped wire 30 is formed by, along the periphery of the penetration hole 201, providing a plurality of through holes 31 that penetrate the board and patterns wires 32 and 33 that connect the through holes to a front surface 221 and a rear surface 222 of the board. For this reason, the individual through holes are provided between the pattern wires 32 and 33 of the front surface of the rear surface of the board. Further, the thickness of each of the through holes is formed to have the substantially same thickness as the thickness of the board. In such a manner, the ring-shaped 30 is obtained.

Moreover, in FIGS. 9B and 9C, the pattern wires 32 and 33 of the front surface and the rear surface of the board overlap each other. Further, an output wire 40 is connected to the ring-shaped wire 30.

In the voltage detection printed board 2 in FIGS. 9A to 9D, when a power transmission conductor 66, in which an AC voltage is generated, is disposed to pass through the penetration hole 201, the ring-shaped wire 30 and a portion of the power transmission conductor 66 facing the ring-shaped wire 30 function as electrodes of a capacitor. That is, the printed board can have a function as the electrodes of the capacitor. Accordingly, portions of the ring-shaped wire 30 correspond to the electrode 91b of the capacitor of the circuit diagram in FIG. 27.

With this configuration, the portions of the ring-shaped wire 30 are formed by the through holes 31 or the pattern wires 32 and 33. Accordingly, there is almost no variation in shape or position. Therefore, when a plurality of voltage detection printed boards 2 are formed, a variation in voltage detection value of the individual voltage detection printed boards 2 can be reduced.

In particular, if AC power to be transmitted through the power transmission conductor 66 is AC power having a frequency of a radio frequency band, a structural variation in the voltage detection printed board 2 may have a large effect on the voltage detection value. However, according to the voltage detection printed board 2 having the above configuration, even though AC power having a frequency of a radio frequency band is adopted, an influence thereof can be suppressed to the minimum.

Moreover, as described below, a voltage conversion circuit 53 corresponding to the voltage conversion circuit 93 shown in FIG. 36 maybe be provided on the voltage detection printed board 2 of FIGS. 9A to 9D. In this case, an output terminal 41 shown in FIGS. 9A to 9D is not required, and thus the output wire 40 of the ring-shaped wire 30 is directly connected to the voltage conversion circuit 53.

Moreover, the ring-shaped wire 30 is an example of a third wire of the invention (a first wire in the case of a voltage detector), and the output wire 40 is an example of a fourth wire of the invention (a second wire in the case of a voltage detector).

FIGS. 10A to 10E are diagrams showing another example of the voltage detection printed board 2 according to the invention.

Figure 10A:
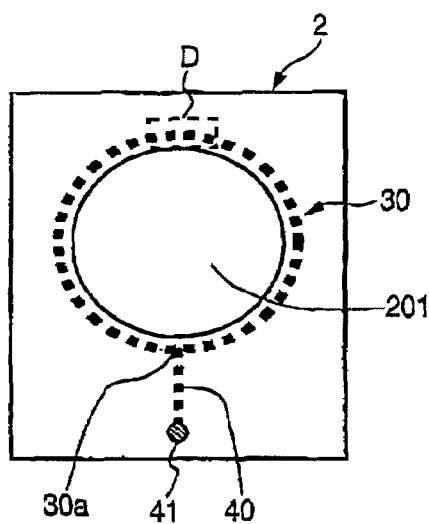
FIGS. 10A to 10E are diagrams showing another example of the voltage detection printed board 2 according to the invention.
Figure 10B:
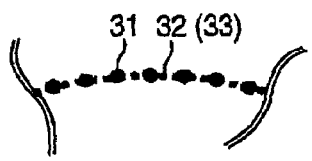
Figure 10C:
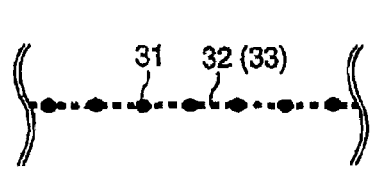
Figure 10D:
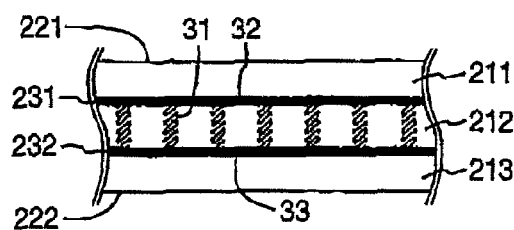
Figure 10E:
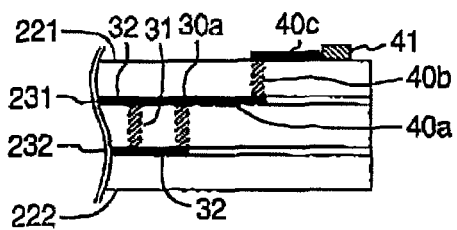

Specifically, FIG. 10A is a plan view of the voltage detection printed board 2. FIG. 10B is a schematic view of a portion (a portion D surrounded by a dotted line) of FIG. 10A on magnified scale. FIG. 10C is a diagram showing linear expansion for simplification of FIG. 10B. FIG. 10D shows a wire of the voltage detection printed board 2 when FIG. 10C is viewed from the side. FIG. 10E shows the wire of the voltage detection printed board 2 paying emphasis on the output wire 40 as viewed from the side. Moreover, as regards the wire shown in FIGS. 10A to 10E, portions that are not typically viewed are shown in perspective view for explanation. In addition, for convenience, the voltage detection printed board 2, through holes 31, pattern wires 32 and 33, and the like are represented by the same reference numerals as those in FIGS. 9A to 9D.

The voltage detection printed board 2 shown in FIGS. 10A to 10E is specifically the same as the voltage detection printed board 2 shown in FIGS. 9A to 9D, except that the board has a multilayer structure, and the ring-shaped wire 30 is formed between inner layers. This is the same as FIGS. 3A to 3E, and the description thereof will be omitted.

For this reason, in FIGS. 10A to 10E, the ring-shaped wire 30 is formed between a first conductive layer 231 and a second conductive layer 232. Accordingly, the ring-shaped wire 30 may not be viewed. Further, in this case, the portions of the ring-shaped wire 30 correspond to the electrode 91b of the capacitor of the circuit diagram in FIG. 36.

The ring-shaped wire 30 is formed by pattern wires 40a connected to one end 30a of the ring-shaped wire 30 formed in the first conductive layer 231, through holes 40b, and pattern wires 40c formed on the front surface of the board 40c, as shown in FIG. 10E. The output wire 40 is connected to an output terminal 41.

Moreover, unlike the above description, as shown in FIGS. 11A and 11B, the ring-shaped wire 30 may be formed.

FIGS. 11A and 11B show another example of the ring-shaped wire 30.

FIG. 11A shows an example where an additional pattern wire for connecting the through holes is provided between a top conductive layer and a bottom conductive layer at penetration portions of the through holes 31. In this example, four pattern wires of a pattern wire 34, a pattern wire 35, a pattern wire 36, and a pattern wire 37 are provided in sequence from the upper portion of the board. As such, three or more pattern wires may be provided.

FIG. 11B shows an example where a pattern wire 38 is provided in only one layer between the top conductive layer and the bottom conductive layer at the penetration portions of the through holes 31. As such, only one pattern wire may be provided.

Accordingly, a pattern wire may be provided in at least one layer between the top conductive layer and the bottom conductive layer at the penetration portions of the through holes so as to connect the through holes. In this case, the portions of the ring-shaped wire 30 correspond to the electrode 91b of the capacitor of the circuit diagram in FIG. 27.

(3) Current/Voltage Detector

FIGS. 12A to 12C are schematic exterior views of a current/voltage detector 3a according to a third embodiment of the invention. Specifically, FIG. 12A is a schematic exterior view three-dimensionally showing the current/voltage detector 3a. FIG. 12B is a schematic exterior view of a conductor casing as viewed from the side. FIG. 12C is a diagram when the conductor casing of FIG. 12B is removed.

As shown in FIG. 12A, like the related art, the current/voltage detector 3a has a structure in which a power transmission conductor 66 can penetrate a casing. Moreover, the power transmission conductor 66 and an insulator 69 surrounding the power transmission conductor 66 are not included in the current/voltage detector 3a but are just shown for explanation. Further, the insulator 69 insulates the power transmission conductor 66 and the current/voltage detector 3a For this reason, an actual length of the insulator 69 is shorter than the length of the insulator 69 shown in the drawing, but it is shown like FIG. 12A for simplification of the drawing. The same is applied to other drawings.

As shown in FIG. 12C, the current detection printed board 1 and the voltage detection printed board 2 are accommodated in the casing. For this reason, a current that flows in the power transmission conductor 66 passing through the casing can be detected by the current detection printed board 1, and a voltage that is generated in the power transmission conductor 66 can be detected by the voltage detection printed board 2.

That is, in the example shown in FIG. 12B, a left portion of the current/voltage detector 3a corresponds to a current detector 340 and a right portion thereof corresponds to a voltage detector 350. Moreover, the casing is formed of a conductor, such as aluminum or the like. Then, the current detector 340 corresponds to the current detector 80 shown in FIG. 36, and the voltage detector 350 corresponds to the voltage detector 90 shown in FIG. 36.

Figure 13A:
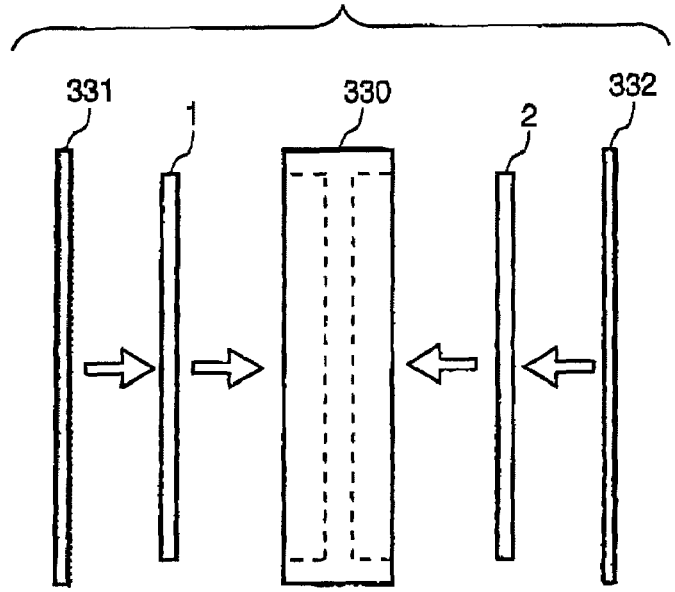
FIGS. 13A and 13B are diagrams showing the schematic configuration of the current/voltage detector 3a shown in FIGS. 12A to 12C.
Figure 13B:
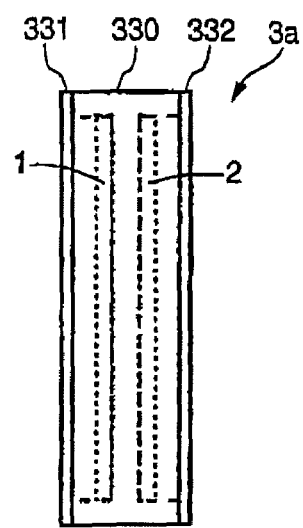

FIGS. 13A and 13B are diagrams showing the schematic configuration of the current/voltage detector 3*a* shown in FIGS. 12A to 12C. Specifically, FIG. 13A is a diagram showing the configuration of the current/voltage detector 3*a*. FIG. 13B is a schematic view showing when individual parts of FIG. 13A are assembled. Moreover, in FIGS. 13A and 13B, the shapes of the individual parts are schematic. For example, a penetration hole through which the power transmission conductor 66 passes or an opening through which a magnetic flux passes is provided in the casing or the board, but it is not shown in the drawings. Further, in FIGS. 13A and 13B, portions that are not viewed front the outside are schematically indicated by dotted lines.

As shown in FIG. 13A, the current/voltage detector 3*a* has a casing main body 330, and the current detection printed board 1, the voltage detection printed board 2, a current detector cover 331, and a voltage detector cover 332 that are fixed to the casing main body 330. Of course, parts, such as screws or beads, for fixing the above-described constituents, but they are regarded as portions of the constituents and are not shown for simplification of explanation. Further, as indicated by an arrow in FIG. 13A, if the constituents are fixed to the casing main body 330, as shown in FIG. 13B, the current detection printed board 1 and the voltage detection printed board 2 are fixed in the casing main body 330, and the current detection printed board 1 and the voltage detection printed board 2 are covered with the covers 331 and 332, respectively.

That is, like the related art, the current detection printed board 1 and the voltage detection printed board 2 are disposed in the casing. The casing main body 330 is common to the current detection printed board 1 and the voltage detection printed board 2. Then, if the current detection printed board 1 is fixed on the front surface of the casing main body 330, the voltage detection printed board 2 is fixed on the rear surface thereof. Accordingly, the current detection printed board 1 and the voltage detection printed board 2 are accommodated in separate spaces, respectively.

Figure 14:
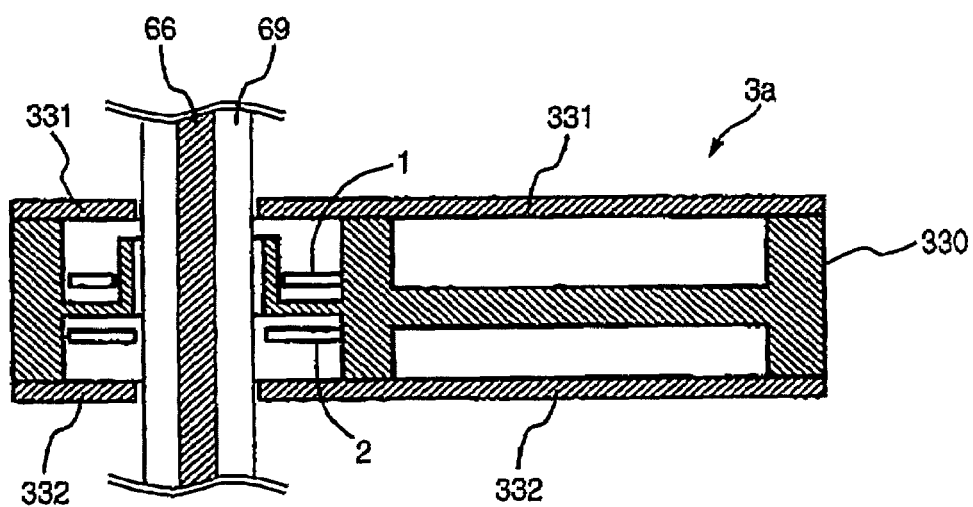
FIG. 14 is a cross-sectional view of the current/voltage detector 3a shown in FIG. 12B.

FIG. 14 is a cross-sectional view of the current/voltage detector 3*a* shown in FIG. 12B. Current detection by the coiled wire 10 will be supplemented with reference to FIG. 14.

In the current detection printed board 1, a magnetic flux required for current detection should act on the coiled wire 10, but it is not desirable that the coiled wire 10 comes under the influence of an electric fields For this reason, as shown in FIG. 14, a casing is adapted such that part of the casing is disposed between the power transmission conductor 66 and the current detection printed board 1 (accurately, between the insulator 69 covering the power transmission conductor 66 and the current detection printed board 1). If doing so, an influence of the electric field on the coiled wire 10 is reduced, and thus current detection accuracy can be increased.

With the current detection printed board 1 and the voltage detection printed board 2, when a plurality of printed boards are formed, a variation in detection value of the individual printed boards can be reduced.

However, as shown in FIGS. 12A to 12C, in the current/voltage detector 3*a* that uses the current detection printed board 1 and the voltage detection printed board 2, the current detection point of the current detection printed board 1 and the voltage detection point of the voltage detection printed board 2 are structurally slightly away from each other in the axial direction of the power transmission conductor 66. That is, a current and a voltage at slightly different points are detected.

Of course, in terms of a phase difference calculated from the detection current and voltage, a current amplitude detection value, and a voltage amplitude detection value, the current detection point and the voltage detection point are preferably the same.

For this reason, it is desirable to approximate the current detection point and the voltage detection point. However, as shown in FIGS. 12A to 12C, it is structurally difficult to perform current detection and voltage detection in different printed boards.

Now, a current/voltage detection printed board that can further approximate the current detection point and the voltage detection point, and a current/voltage detector using the printed board will be described.

(4) Current/Voltage Detection Printed Board

Although an example in which the coiled wire 10 and the ring-shaped wire 30 are formed in different printed boards has been hitherto described, as shown in FIGS. 15A to 15E, they may be formed in the same printed board. This example will be described with reference to FIGS. 15A to 15E.

FIGS. 15A to 15E are diagrams showing an example of a current/voltage detection printed board 4 according to the invention.

Figure 15A:
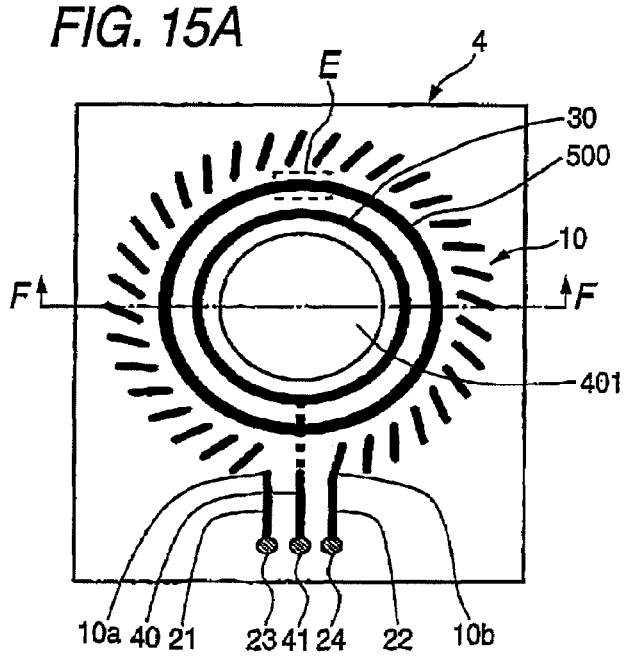
FIGS. 15A to 15E are diagrams showing an example of a current/voltage detection printed board 4 according to the invention.
Figure 15B:
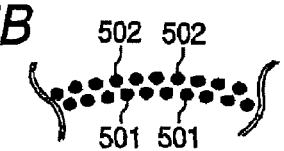
Figure 15C:
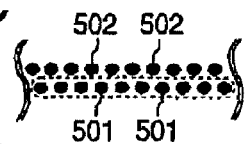
Figure 15D:
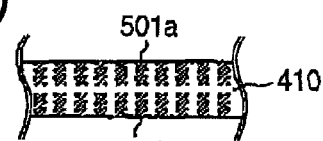
Figure 15E:
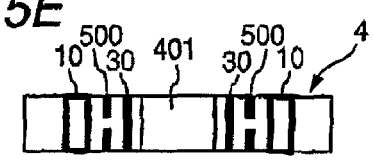

Specifically, FIG. 15A is a plan view of a current/voltage detection printed board 4 (as viewed from the above). FIG. 15B is a schematic view of a portion (a portion E surrounded by a dotted line) of FIG. 1A on magnified scale. FIG. 15C is a diagram showing linear expansion for simplification of FIG. 15B. FIG. 15D is a schematic view when a portion of FIG. 15C is viewed from the side. FIG. 15E is a cross-sectional view taken along the line F-F of FIG. 15A.

As shown in FIG. 15A, a current/voltage detection printed board 4 is provided with a penetration hole 401 that penetrates the board. A ring-shaped wire 30 is formed at the periphery of the penetration hole 401. An output wire 40 and an output terminal 41 are connected to the ring-shaped wire 30.

A shield portion 500 having a shield function is formed outside the ring-shaped wire 30. The shield portion 500 will be described below.

A coiled wire 10 is formed outside the shield portion 500. Output wires 21 and 22 are connected to the coiled wire 10. Output terminals 23 and 24 are connected to the output wires 21 and 22, respectively.

The coiled wire 10 is the same as that shown in FIG. 1A. Although the coiled wire 10 shown in FIG. 1A is formed at the periphery of the penetration hole 101, and the coiled wire 10 shown in FIG. 15A is formed outside the shield portion 500, both the coiled wires 10 function as a current transformer. The output wires 21 and 22 and the output terminals 23 and 24 are the same as those shown in FIG. 1A.

Figure 19A:
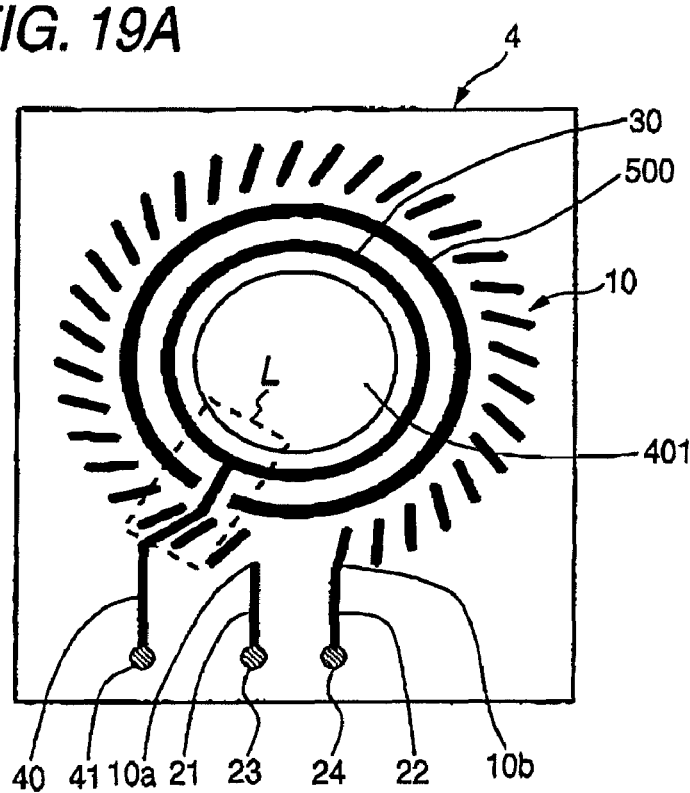
FIGS. 19A and 19B are diagrams showing another example of the output wire 40 that is connected to the ring-shaped wire 30.

The ring-shaped wire 30 is the same as that shown in FIG. 9A. Although the ring-shaped wire 30 shown in FIG. 9A is formed at the periphery of the penetration hole 201, and the ring-shaped wire 30 shown in FIG. 15A is formed at the periphery of the penetration hole 401, both the ring-shaped wires 30 function as an electrode of a capacitor. As shown in FIG. 19A, the output wire 40 is slightly different from that shown in FIG. 9A, but it has a function to output a voltage generated in the ring-shaped wire 30, similarly to that shown in FIG. 9A.

As such, the coiled wire 10 and the like are different from those shown in FIG. 1A, but they have the same basic configuration. In addition, the ring-shaped wire 30 and the like are different from those shown in FIG. 9A, but they have the same basic configuration. Thus, detailed descriptions of the coiled wire 10 and the like, and the ring-shaped wire 30 will be omitted. Moreover, for convenience of explanation, constituents having the same functions as those described above are represented by the same reference numerals.

The current/voltage detection printed board 4 includes the coiled wire 10 and the ring-shaped wire 30, and thus it has a voltage detection function and a current detection function. The voltage detection point and the current detection point can be substantially the same.

If AC power to be transmitted through the power transmission conductor 66 is AC power having a frequency of a radio frequency band, a variation in winding interval or winding strength in the coiled wire 10 may have a large effect on the current detection value. In addition, a structural variation in the ring-shaped wire 30 may have a large effect on the voltage detection value. However, according to the current/voltage detection printed board 4 having the above configuration, even though AC power having a frequency of a radio frequency band is adopted, an influence thereof can be suppressed to the minimum.

Next, the shield portion 500 will be described. The shield portion 500 is formed by arranging a plurality of through holes 501 and 502 in a substantially circuit shape, as shown in FIGS. 15B and 15C. Specifically, the shield portion 500 is formed by arranging a plurality of through holes in a substantially circuit shape and in at least two lines.

In the illustrated example, a plurality of through holes 501 are arranged inside of the shield portion 500 (a side close to the penetration hole 401) in a substantially circular shape, and a plurality of through holes 502 are arranged outside the shield portion 500 in a substantially circuit shape. The through holes 501 and the through holes 502 are arranged with a position shift. For this reason, when the shield portion 500 is viewed from the side, the through holes 501 and the through holes 502 overlap each other, and a gap disappears. Therefore, the shield portion 500 shields an electric field generated when the power transmission conductor 66 is disposed to pass through the penetration hole 401. In addition, since the through holes can be easily formed in manufacturing the printed board, the shield portion 500 is easily formed.

Figure 28:
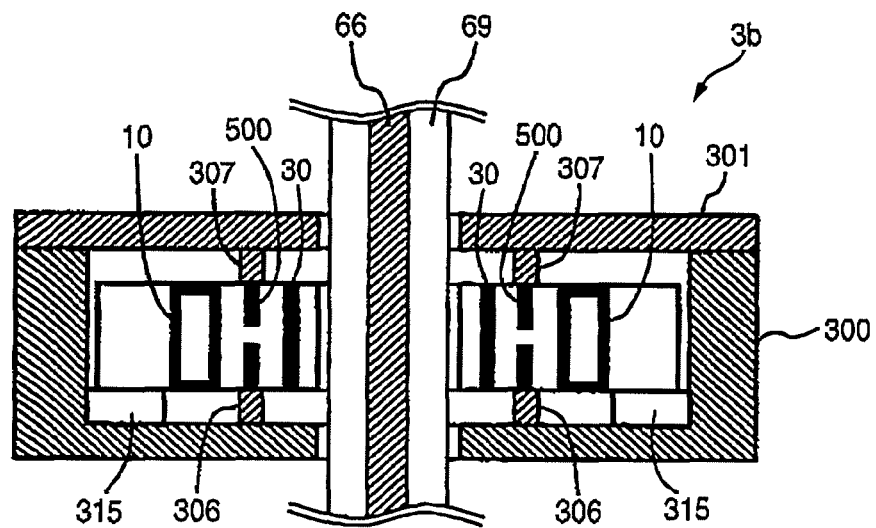
FIG. 28 show an example of a cross-sectional view when the current/voltage detection printed board 4 is accommodated in the casing.

As shown in FIG. 28 and the like, the shield portion 500 needs to be connected to the casing. The single current/voltage detection printed board 4 does not have a shield function of the shield portion 500. However, as for the structure of the current/voltage detection printed board, as described above with reference to FIGS. 15A to 15E, the shield portion 500 needs to be provided between the coiled wire 10 and the ring-shaped wire 30.

In FIGS. 15A to 15E, the shield portion 500 is formed by the through holes arranged double, but the through holes may be arranged in three lines or more. In this case, according to the above concept, it is preferable to make a gap between the through holes forming the shield portion 500 disappear as the shield portion 500 is viewed from the side.

FIG. 15D is a schematic view when the plurality of through holes 501 shown in FIG. 15C are viewed from the side. As shown in FIG. 15D, the current/voltage detection printed board 4 is a multilayer board. In addition, as shown in FIG. 15D, the through holes 501 include upper through holes 501*a* and lower through holes 501*b*, and are formed so as not to pass through the board. Though not shown in FIG. 15D, similarly, the through holes 502 include upper through holes 502*a* and lower through holes 502*b*, and are formed so as not to pass through the board. That is, the shield portion 500 is provided with an unshielded portion between the front surface and the rear surface of the board. This will also be apparent from FIG. 15E. FIG. 15E is a cross-sectional view taken along the line F-F of FIG. 15A, which schematically shows an example of the shield portion 500 and the like.

Ad described above, the shield portion 500 is formed in a substantially circular shape, but the invention is not limited thereto. What is necessary is that the shield portion 500 is provided between the coiled wire 10 and the ring-shaped wire 30. Therefore, the shield portion 500 may have an elliptical shape or may partially have a linear shape. If the coiled wire 10 and the ring-shaped wire 30 substantially have a circular shape, in terms of reduction in area, the shield portion 500 may also substantially have a circular shape.

Figure 16A:
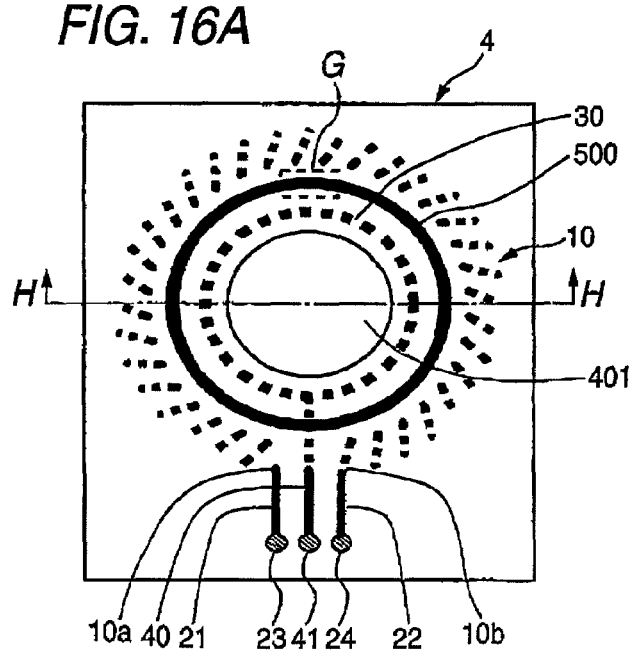
FIGS. 16A to 16E are diagrams showing another example of the current/voltage detection printed board 4 according to the invention.
Figure 16B:
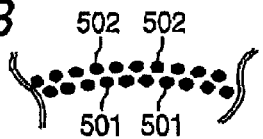
Figure 16C:
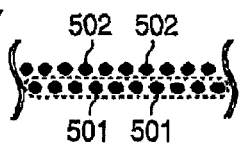
Figure 16D:
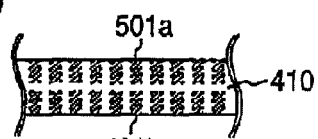
Figure 16E:
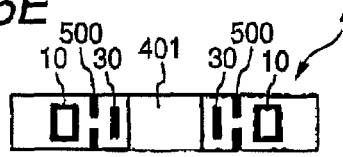

FIGS. 16A to 16E are diagrams showing another example of the current/voltage detection printed board 4 according to the invention. Specifically, FIG. 16A is a plan view of the current/voltage detection printed board 4 (as viewed from the above). FIG. 16B is a schematic view of a portion (a portion G surrounded by a dotted line) of FIG. 16A on magnified scale. FIG. 16C is a diagram of showing linear expansion for simplification of FIG. 16B. FIG. 16D is a schematic view when a portion of FIG. 16C is viewed from the side. FIG. 16E is a cross-sectional view taken along the line H-H of FIG. 16A.

The current/voltage detection printed board 4 shown in FIG. 16A includes a coiled wire 10 and a ring-shaped wire 30, which are different from those in FIG. 15A.

Specifically, the coiled wire 10 shown in FIG. 16A is the same as that shown in FIG. 3A and the ring-shaped wire 30 is the same as that shown in FIG. 10A. A shield portion 500 is the same as that shown in FIG. 15A. Thus, detailed descriptions thereof will be omitted. Moreover, for convenience of explanation, constituents having the same functions as those described above are represented by the same reference numerals.

Similarly to FIG. 15A, the coiled wire 10 and the like are different from those shown in FIG. 3A, but they have the same basic configuration. The coiled wire 10 functions as a current transformer. In addition, the ring-shaped wire 30 and the like are different from those shown in FIG. 10A, but they have the same basic configuration. The ring-shaped wire 30 functions as an electrode of a capacitor.

As such, other examples of the coiled wire 10 or the ring-shaped wire 30 described hitherto may be used. For this reason, as for the coiled wire 10, the coiled wires 10 shown in FIGS. 5, 7, and 8A to 8E, and the equivalents thereof may be used. As for the ring-shaped wire 30, the ring-shaped wires 30 shown in FIGS. 11A and 11B and the equivalents thereof may be used.

The output wire 40 that is connected to the ring-shaped wire 30 will now be described.

Figure 17A:
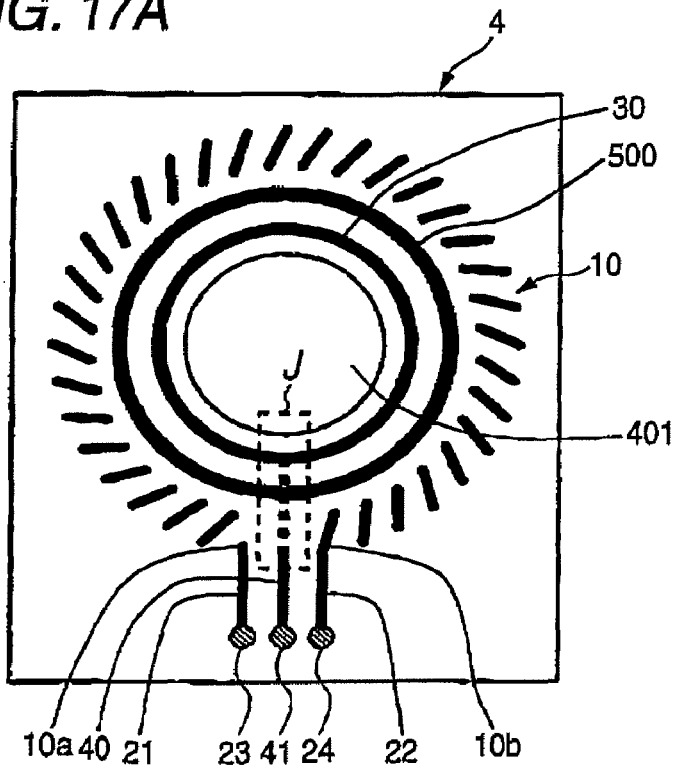
FIGS. 17A and 17B are diagrams showing an example of an output wire 40 that is connected to a ring-shaped wire 30.
Figure 17B:
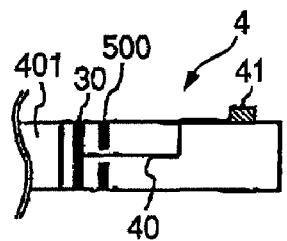

FIGS. 17A and 17B are diagrams showing an example of the output wire 40 that is connected to the ring-shaped wire 30. Specifically, FIG. 17A is a plan view of the current/voltage detection printed board 4 (as viewed from the above), and FIG. 17B is a partial cross-sectional view of a portion (a portion J surrounded by a dotted line) of FIG. 17A as viewed from the side. Moreover, FIG. 17B schematically shows an example of a section.

As shown in FIGS. 17A and 17B, the output wire 40 that is connected to the ring-shaped wire 30 passes through a portion near the center of the board ring-shaped wire 30 from a portion near the center of the through hole, and is led to the surface of the board and connected to the output terminal 41.

Figure 18A:
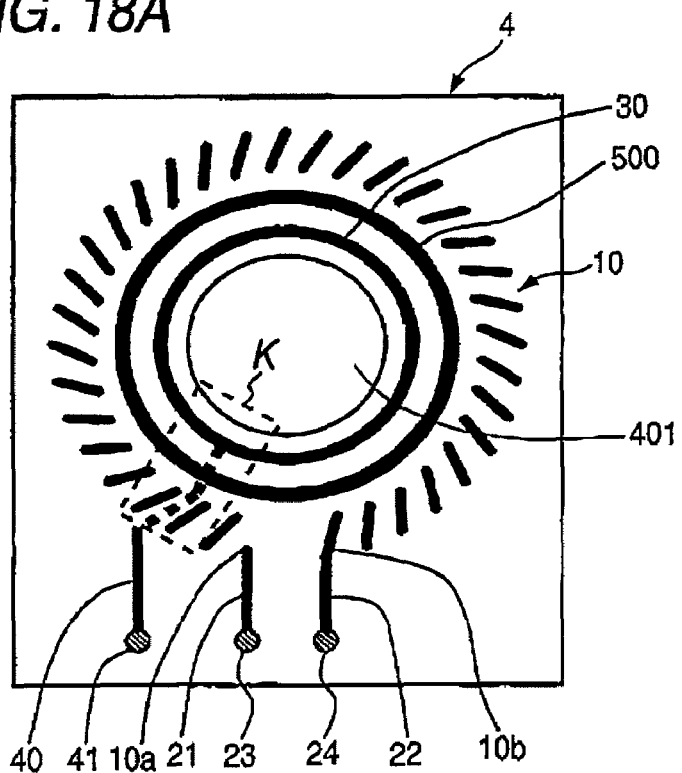
FIGS. 18A and 18B are diagrams showing another example of the output wire 40 that is connected to the ring-shaped wire 30.
Figure 18B:
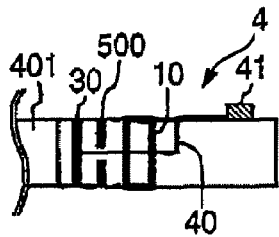

FIGS. 18A and 18B are diagrams showing anther example of the output wire 40 that is connected to the ring-shaped wire 30. Specifically, FIG. 18A is a plan view of the current/voltage detection printed board 4 (as viewed from the above).

FIG. 10B is a partial cross-sectional view of a portion (a portion K surrounded by a dotted line) of FIG. 18A as viewed from the side. Moreover, FIG. 18B schematically shows an example of a section.

FIGS. 18A and 18B are basically the same as FIGS. 17A and 17B, except that the output wire 40 passes through the coiled wire 10. FIG. 18B schematically shows an example of a section, and thus, in FIG. 18B, the output wire 40 and the coiled wire 10 seem to overlap each other. However, actually, they are formed so as not to be in contact with each other.

Figure 19B:
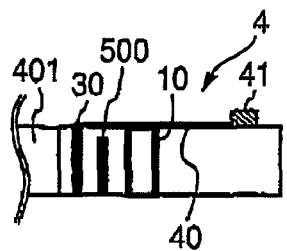

FIGS. 19A and 19B are diagrams showing another example of the output wire 40 that is connected to the ring-shaped wire 30. Specifically, FIG. 19A is a plan view of the current/voltage detection printed board 4 (as viewed from the above). FIG. 19B is a partial cross-sectional view of a portion (a portion L surrounded by a dotted line) a) of FIG. 19A as viewed from the side. Moreover, FIG. 19B schematically shows an example of a section.

FIGS. 19A and 19B are similar to FIGS. 18A and 18B, except that the output wire 40 is formed on the surface of the board, and passes through the coiled wire 10. FIG. 19B schematically shows an example of a section, and thus, in FIG. 19B, the output wire 40 and the coiled wire 10 seems to overlap each other. However, actually, they are formed so as not to be in contact with each other.

The shield portion 500 is basically formed as described with reference to FIGS. 15B to 15D, but a portion through which the output wire 40 passes is formed as described with reference to FIG. 19B. That is, only a portion near the surface of the board is unshielded. As such, the shield portion 500 may be formed in such a manner that a portion is different from other portions. As shown in FIG. 19A, the shield portion 500 including a cutout portion substantially has a circular shape.

Figure 20A:
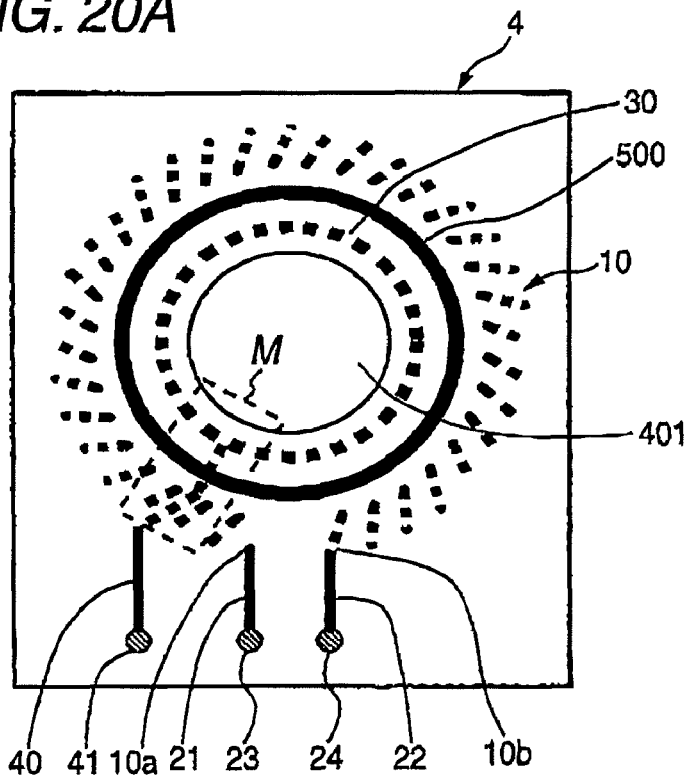
FIGS. 20A and 20B are diagrams showing another example of the output wire 40 that is connected to the ring-shaped wire 30.
Figure 20B:
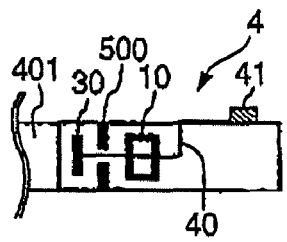

FIGS. 20A and 20B are diagrams showing another example of the output wire 40 that is connected to the ring-shaped wire 30. Specifically, FIG. 20A is a plan view of the current/voltage detection printed board 4 (as viewed from the above). FIG. 20B is a partial cross-sectional view of a portion (a portion M surrounded by a dotted line) of FIG. 20A as viewed from the side. Moreover, FIG. 20B schematically shows an example of a section.

FIGS. 20A and 20B are similar to FIGS. 19A and 19B, but a ring-shaped wire 30 and a coiled wire 10 are different from those shown in FIGS. 19A and 19B.

Specifically, the ring-shaped wire 30 shown in FIG. 16A is the same as that shown in FIG. 10A and the coiled wire 10 is the same as that shown in FIG. 3A. That is, the configuration shown in FIGS. 20A and 20B is the combination of FIG. 16A and FIG. 18A.

As such, various aspects of the output wire 40 that is connected to the ring-shaped wire 30 can be considered. In addition, various aspects of the shield portion 500 can also be considered.

(5) Current/Voltage Detector (Second Example):

FIG. 21 is a schematic exterior view three-dimensionally showing a current/voltage detector 3b according to the invention.

As shown in FIG. 21, the current/voltage detector 3b has such a structure that a power transmission conductor 66 can pass through a casing, like the related art. The power transmission conductor 66 and an insulator 69 at the periphery of the power transmission conductor 66 are not included in the current/voltage detector 3b but are just shown for explanation. The insulator 69 insulates the power transmission conductor 66 from the current/voltage detector 3b. For this reason, the actual length of the insulator 69 is shorter than the length of the insulator 69 shown in the drawing, but it is shown like FIG. 21A for simplification of the drawings. The same is applied to other drawings (for example, FIG. 28). Moreover, the casing is formed of a conductor, such as aluminum.

FIG. 22 is a diagram showing the schematic configuration of the current/voltage detector 3b shown in FIG. 21. In FIG. 22, the shapes of the individual constituents are schematic. For example, a penetration hole through which the power transmission conductor 66 passes is provided in the casing or the board, but it is not shown in the drawing.

As shown in FIG. 22, the current/voltage detector 3b includes a casing main body 300, a current/voltage detection printed board 4 fixed to the casing main body 300, and a cover 301. Of course, parts, such as screws or beads, for fixing the above-described constituents are also included, but they are regarded as portions of the constituents and are not shown for simplification of explanation. The cover 301 is a portion of the casing and is formed of a conductor, such as aluminum. In addition, as indicated by arrows in FIG. 22, if the constituents are fixed to the casing main body 300, the current/voltage detection printed board 4 is fixed in the casing main body 300, and the current/voltage detection printed board 4 is covered with the cover 301.

Next, other portions than the cover 301 will be described in detail.

Figure 23A:
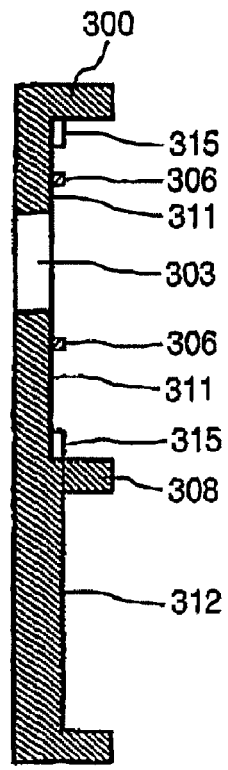
FIGS. 23A and 23B are diagrams of a casing main body 300.
Figure 23B:
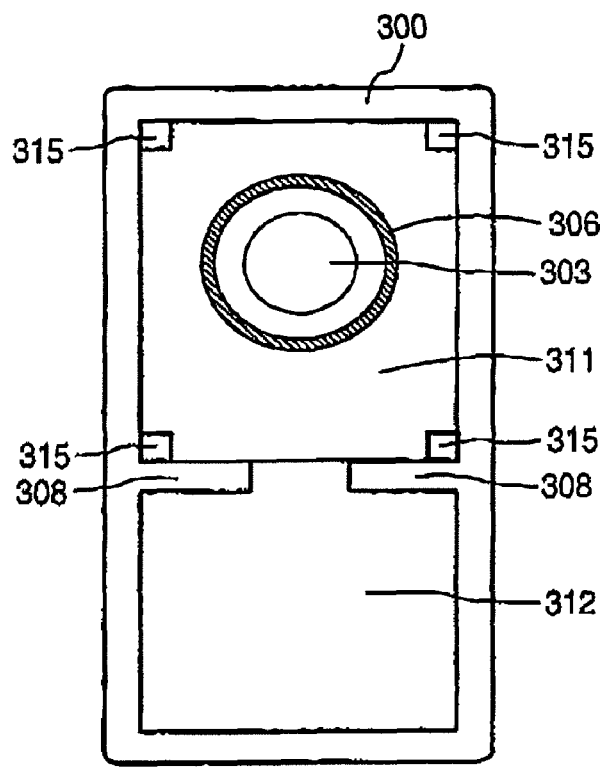

FIGS. 23A and 23B are diagrams of the casing main body 300. Specifically, FIG. 23A is a cross-sectional view of a side surface of the casing main body 300. FIG. 23B is a plan view as viewed from a side on which the current/voltage detection printed board 4 is fixed.

Figure 24:
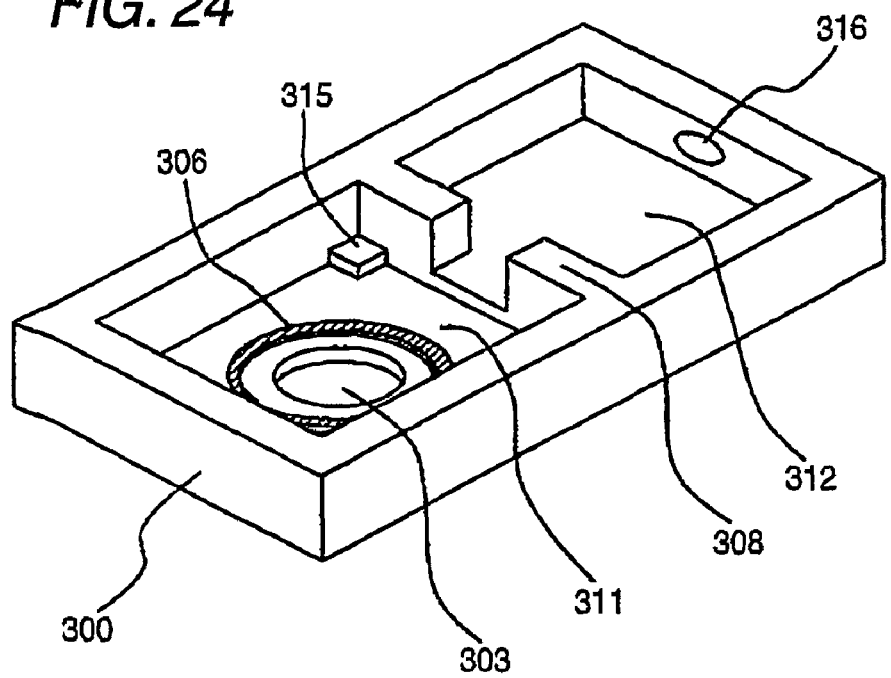
FIG. 24 is a diagram three-dimensionally showing the casing main body 300.

FIG. 24 is a diagram three-dimensionally showing the casing main body 300.

Figure 25:
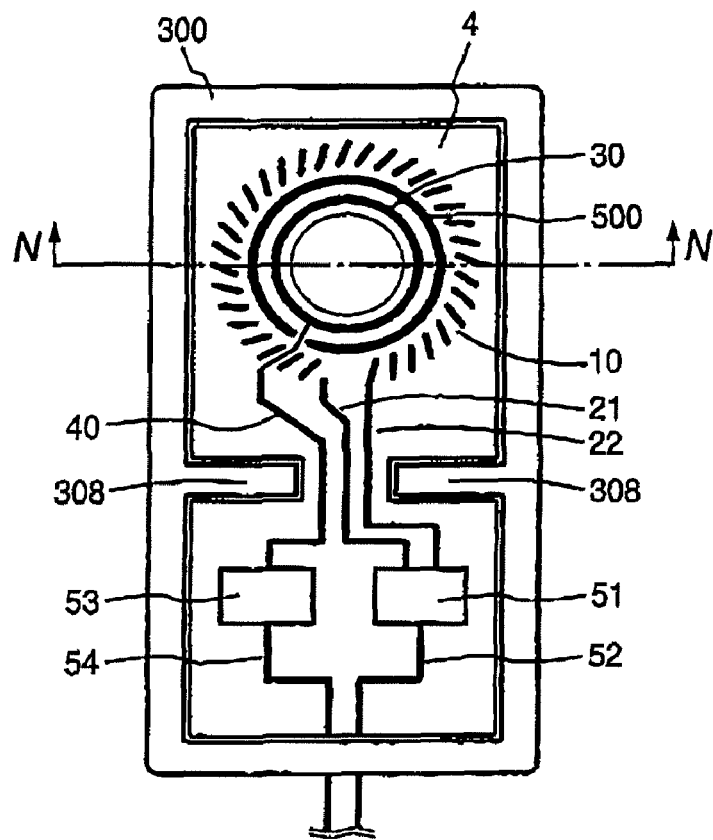
FIG. 25 is a diagram when the current/voltage detection printed board 4 is mounted on the casing main body 300 in a state where the cover 301 is not mounted.

FIG. 25 is a diagram when the current/voltage detection printed board 4 is mounted on the casing main body 300 in a state where the cover 301 is not mounted. The current/voltage detection printed board 4 is, for example, the same as that shown in FIG. 19A.

As shown in FIGS. 23A and 23B, 24, and 25, the casing main body 300 is provided with a penetration hole 303 and concave portions 311 and 312. Therefore, the power transmission conductor 66 and the insulator 69 covering the power transmission conductor 66 can pass through the casing main body 300, and the current/voltage detection printed board 4 can be accommodated in the casing.

A first casing shield portion 306 is a portion of the casing main body 300, and when the current/voltage detection printed board 4 is mounted on the casing main body 300, it is connected to the shield portion 500. That is, the first casing shield portion 306 is formed in a substantially circular shape according to the shape of the shield portion 500. Of course, as described above, when the shield portion 500 does not have a substantially circular shape, the first casing shield portion 306 may be formed to have a shape according to the shape of the shield portion 500. The first casing shield portion 306 may be detachably provided, for example, by screws. In this case, the first casing shield portion 306 is also regarded as a portion of the casing main body 300. In addition, the first casing shield portion 306 is formed of a conductor, such as aluminum, similarly to the casing main body 300.

Though not shown in FIGS. 23A and 23B, 24, and 25, the cover 301 is provided with a second casing shield portion 307, which is the same as the first casing shield portion 306, as shown in FIG. 28 and the like. Specifically, after the current/voltage detection printed board 4 is mounted on the casing main body 300, when the cover 301 is mounted on the casing main body 300, the second casing shield portion 307 is connected to the shield portion 500. That is, the second casing shield portion 307 is formed in a substantially circuit shape according to the shape of the shield portion 500.

The second casing shield portion 307 may be detachably provided, for example, by screws. In this case, the second casing shield portion 307 is also regarded as a portion of the cover 301. In addition, the second casing shield portion 307 is formed of a conductor, such as aluminum. The functions of the shield portion 500 and the like will be described below.

Four board fixing portions 315s are provided at four corners of the concave portion 311, and the current/voltage detection printed board 4 is fixed to the portions. This is to allow the current/voltage detection printed board 4 to float with respect to the bottom surface of the concave portion 311 such that the wire provided in the current/voltage detection printed board 4 does not come into contact with the casing (the shield portion 500 is not regarded to as a wire).

For example, unlike FIGS. 16A to 16E, when the coiled wire 10 and the ring-shaped wire 30 of the current/voltage detection printed board 4 are not formed on the rear surface layer of the board, the board fixing portions 315 provided at the four corners of the concave portion 311 can be removed. Then, the bottom surface of the concave portion 311 can have the same height as the bottom surface of the concave portion 312. In addition, the first casing shield portion 306 is not required.

Figure 26:
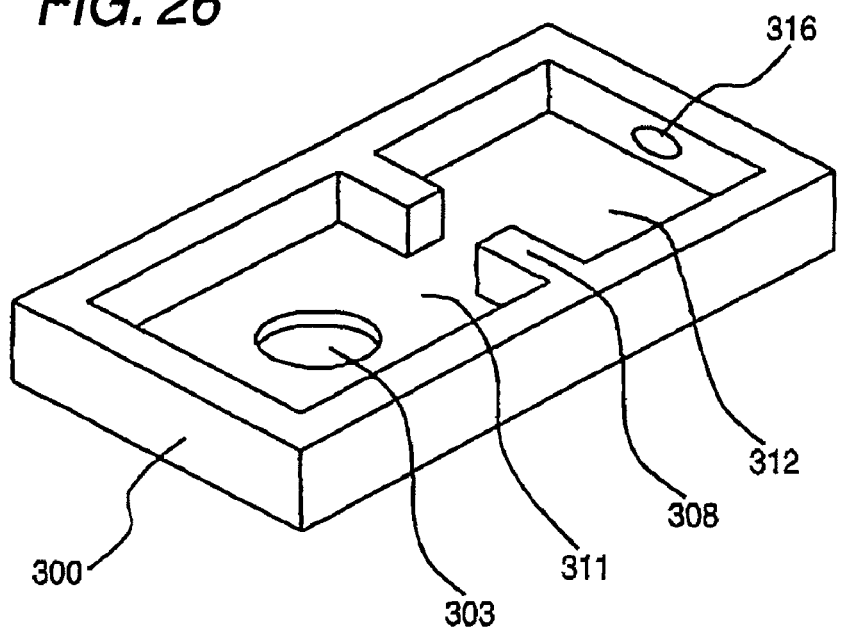
FIG. 26 is a diagram three-dimensionally showing the casing main body 300 when no board fixing portion 315 is provided.

FIG. 26 is a diagram three-dimensionally showing the casing main body 300 when no board fixing portion 315 is provided. With the configuration as shown in FIG. 26, the structure of the casing main body 300 can be simplified.

Usually, the cylindrical (a circular shape in section) power transmission conductor 66 is used, and accordingly the penetration hole 303 provided in the casing main body 300 also has a circular shape. In addition, the penetration hole 401 of the current/voltage detection printed board 4 has a circular shape, and the ring-shaped wire 30 is formed in a circuit shape along the periphery of the penetration hole 401.

Next, the current/voltage detection printed board 4 will be described.

The coiled wire 10 of the current/voltage detection printed board 4 is the same as described with reference to FIGS. 19A and 19B, and the output wires 21 and 22 are connected to the current conversion circuit 51 in forms of pattern wires. The current conversion circuit 51 corresponds to the current conversion circuit 84 shown in FIG. 36.

The ring-shaped wire 30 of the current/voltage detection printed board 4 is the same as described with reference to FIGS. 19A and 19B, and the output wire 40 is connected to the voltage conversion circuit 53 in forms of the pattern wire. The voltage conversion circuit 53 corresponds to the voltage conversion circuit 93 shown in FIG. 36.

Therefore, unlike the current/voltage detection printed board 4 described with reference to FIGS. 19A and 19B, the coiled wire 10, the ring-shaped wire 30, the current conversion circuit 51, and the voltage conversion circuit 53 are provided on the same board.

An output wire 52 connected to the current conversion circuit 51 extends toward the outside of the casing through a wire opening 316. Moreover, the current conversion circuit 51 has an output terminal to which the output wire 52 is connected. The output wire 52 may be partially a pattern wire or may be overall a wire other than the pattern wire.

An output wire 54 connected to the voltage conversion circuit 53 extends towards the outside of the casing through the wire opening 316. Moreover, the voltage conversion circuit 53 has an output terminal to which the output wire 54 is connected. The output wire 54 may be partially a pattern wire or may be overall a wire other than the pattern wire. In this example, the output wire 52 and the output wire 54 extend towards the outside of the casing through the same opening 316, but they may extend towards the outside of the casing through different openings.

If AC power to be transmitted through the power transmission conductor 66 is AC power having a frequency of a radio frequency band, a variation in winding interval or winding strength of the coiled wire 10 has a large effect on the current detection value. In addition, a structural variation in the ring-shaped wire 30 has a large effect on the voltage detection value. A variation in the shape of the output wire also has an effect on the detection value. However, according to the current/voltage detection printed board 4 having the above configuration, even though AC power having a frequency of a radio frequency band is adopted, an influence thereof can be suppressed to the minimum.

In the casing main body 300, a third casing shield portion 308 is provided at a corresponding position between the coiled wire 10 of the current/voltage detection printed board 4 and the current conversion circuit 51. For this reason, the current/voltage detection printed board 4 has a partially narrow width according to the third casing shield portion 308.

In this example, the third casing shield portion 308 has a function to shield a space where the coiled wire 10 and the ring-shaped wire 30 are provided and a space where the current conversion circuit 51 and the voltage conversion circuit 53 are provided.

Figure 27A:
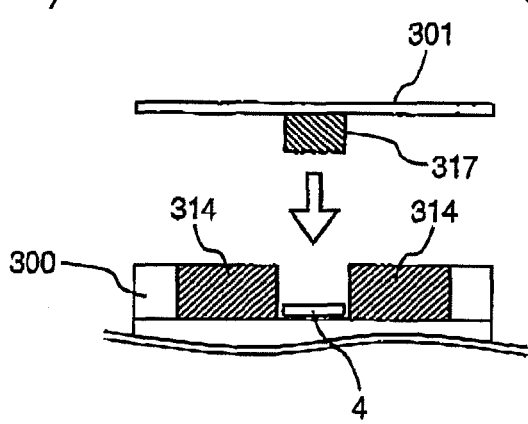
FIGS. 27A and 27B show an example of an application of a third casing shield portion 308.
Figure 27B:
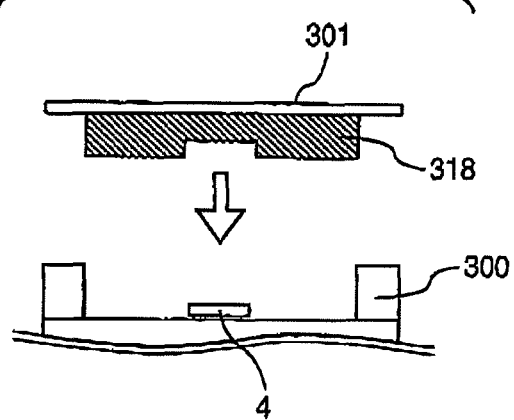

FIGS. 27A and 27B show an example of an application of the third casing shield portion 308.

As shown in FIGS. 23A and 23B, and 24 to 26, since only with the third casing shield portion 308 of the casing main body 300, a gap occurs in the output wires, shield may not be sufficient. In this case, as shown in FIG. 27A, a shield portion 317 for burying the gap may be provided in the cover 301. In such a manner, the gap in the output wires is almost removed, and thus a shield effect increases. In addition, as shown in FIG. 27B, instead of the third casing shield portion 308, a shield portion 318 may be provided in the cover 301.

Next, the shield function of the shield portion 500 will be described.

FIG. 28 shows an example of a cross-sectional view when the current/voltage detection printed board 4 is accommodated in the casing. Specifically, FIG. 28 schematically shows a section taken along the line N-N of FIG. 25 in a state where the cover 301 is mounted.

As shown in FIG. 28, in a state where the current/voltage detection printed board 4 is accommodated, when the power transmission conductor 66 used as an AC power transmission path is disposed to pass through the penetration hole 401, the ring-shaped wire 30 functions as an electrode of a capacitor. This is, for example, the same as a case where the voltage detection printed board 2 shown in FIG. 9A is accommodated in the casing, as shown in FIG. 12B.

However, the coiled wire 10 is different from a case where the current detection printed board 1 shown in FIG. 1A is accommodated in the casing, as shown in FIG. 12B. That is, considering the coiled wire 10 only, as described above, the coiled wire 10 of the current detection printed board 1 shown in FIG. 1A and the like is the same as the coiled wire 10 of the current/voltage detection printed board 4 shown in FIG. 15A or the like. However, in case of the connection state shown in FIG. 28, the ring-shaped wire 30 is provided between the power transmission conductor 66 and the coiled wire 10. Accordingly, it is different from the connection state shown in FIG. 12B.

Considering that no shield portion 500 is provided, a space between the coiled wire 10 and the ring-shaped wire 30 is not shielded, and accordingly a magnetic flux required for current detection acts on the coiled wire 10. At this time, the coiled wire 10 comes under the influence of an electric field. However, as described above, it is not desirable that the coiled wire 10 comes under the influence of the electric field, and in this case, current detection accuracy may be lowered. For this reason, even though the coiled wire 10 and the ring-shaped wire 30 are provided in the same board, it is necessary to reduce the influence of the electric field on the coiled wire 10, thereby increasing the current detection accuracy.

Therefore, the shield portion 500 and the shield portions above and below the shield portion 500 (the first casing shield portion 306 and the second casing shield portion 307) are provided to shield the space between the coiled wire 10 and the ring-shaped wire 30 as large as possible. Of course, since the magnetic flux required for current detection should act on the coiled wire 10, the space is not completely shielded, and a partially unshielded portion is provided.

From a viewpoint of shield, the unshielded portion is preferably as small as possible, but in terms of current detection by the coiled wire 10 or the output wires described with reference to FIGS. 17A and 17B and the like, it is preferable to design the shield portion in consideration of this balance. In any cases, the influence of the electric field on the coiled wire 10 can be reduced, as compared with a case where no shield portion 500 is provided, and the magnetic flux required for current detection can act on the coiled wire 10.

Therefore, in the current/voltage detector shown in FIGS. 12A to 12C, a problem that the current detection point and the voltage detection point are away from each other can be resolved, and the current detection point and the voltage detection point can be substantially the same.

As will be apparent from the above description, the shield portion 500 is connected to the first casing shield portion 306 and the second casing shield portion 307 above and below the shield portion 500. Then, the shield portion 500 is electrically connected to the casing. Therefore, the shield portion 500 has a shield function.

Although the ring-shaped wire 30 and the shield portion 500 are both formed by the through holes, both are different from each other in structure and function.

Figure 29A:
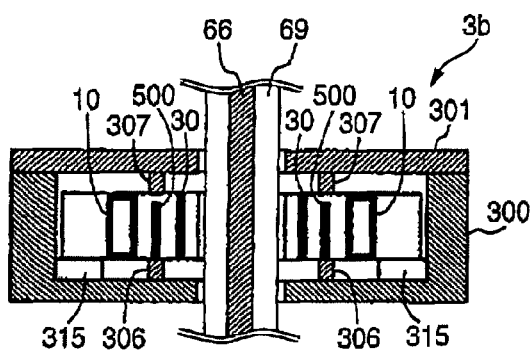
FIGS. 29A and 29B show another example of cross-sectional views when the current/voltage detection printed board 4 is accommodated in the casing.
Figure 29B:
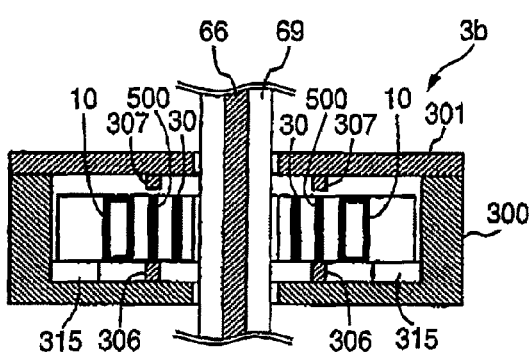

FIGS. 29A and 29B are another example of cross-sectional views when the current/voltage detection printed board 4 is accommodated in the casing.

Unlike FIG. 28, FIG. 29A shows an example where the through holes forming the shield portion 500 are not divided into two groups, but are provided in the board, excluding the front surface of the board. That is, a so-called blind via is formed. As such, the shield portion 500 has a configuration different from that shown in FIG. 28, but it is the same as that shown in FIG. 28 in that an unshielded portion is provided in a portion between the front surface and the rear surface of the board. In such a manner, similarly to FIG. 28, an electric field is shielded, and a magnetic flux acts on the coiled wire 10.

In FIG. 29B, unlike FIG. 28, the through holes forming the shield portion 500 pass through the board. Instead, the second casing shield portion 307 is not connected to the shield portion 500, and thus a gap is empty. In this case, although no unshielded portion is provided in a portion between the front surface and the rear surface of the board, the same effects as those in FIGS. 28 and 29A. That is, similarly to FIG. 28 and 29A, an electric field is shielded, and a magnetic flux acts on the coiled wire 10.

Figure 30A:
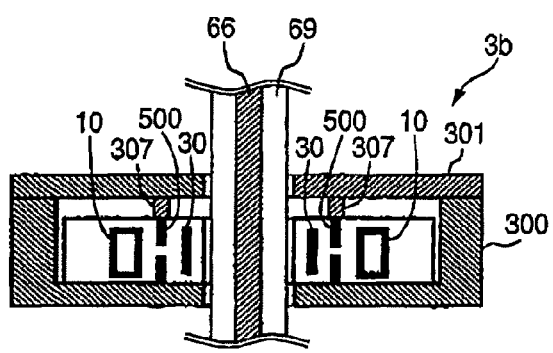
FIGS. 30A and 30B show another example of cross-sectional views when the current/voltage detection printed board 4 is accommodated in the casing.
Figure 30B:
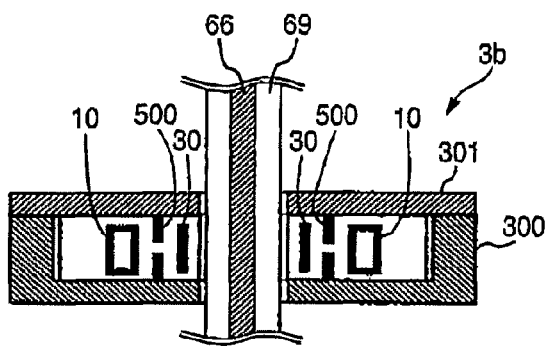

FIGS. 30A and 30B are another example of cross-sectional views when the current/voltage detection printed board 4 is accommodated in the casing.

FIG. 30A shows an example where the casing main body 300 shown in FIG. 26 and the current/voltage detection printed board 4 shown in FIG. 16A are used. That is, since the coiled wire 10 and the ring-shaped wire 30 are formed between inner layers, the casing main body 300 shown in FIG. 26 can be used, and the first casing shield portion 306 can be removed. In this case, the through holes forming the shield portion 500 are connected to the casing main body 300, and thus the same effects as those in FIG. 28 and FIGS. 29A and 29B are obtained.

FIG. 30B shows an example where the second casing shield portion 307 is removed, and the casing main body 300 is adapted such that the through holes are connected to the cover 301. In this case, the same effects as those in FIG. 28 and FIGS. 29A and 29B are obtained.

Modifications of Current/Voltage Detector

Figure 31:
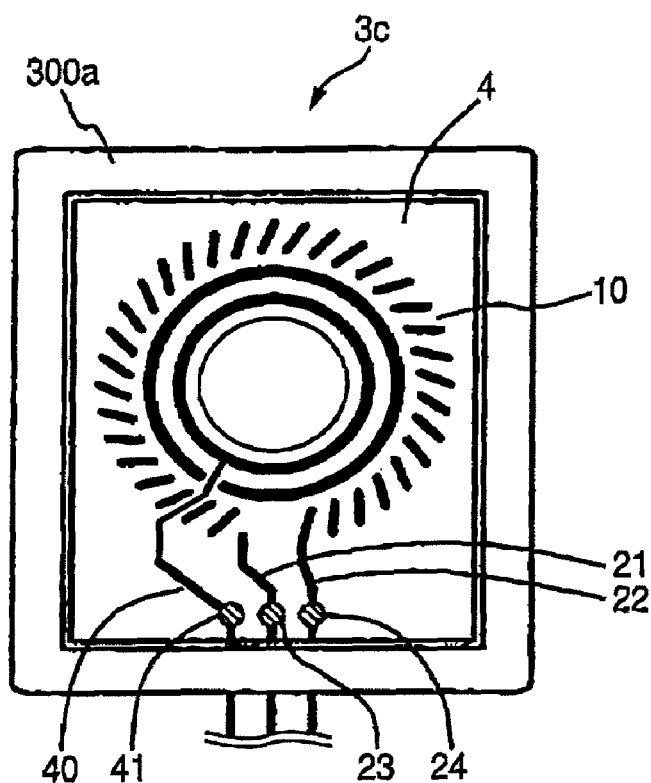
FIG. 31 is a diagram showing a current/voltage detector 3c as a modification of the current/voltage detector 3b.

FIG. 31 shows a current/voltage detector 3c as a modification of the current/voltage detector 3b. Here, a cover 301a is not shown. Specifically, FIG. 31 shows a case where the current/voltage detection printed board 4 is the same as that shown in FIGS. 19A and 19B. As shown in FIG. 31, the current conversion circuit 51 and the voltage conversion circuit 53 may be provided outside the current/voltage detector 3c. The casing includes a casing main body 300a having a shape for the current/voltage detection printed board 4. The output of the current/voltage detection printed board 4 is output outside the casing by output wires, not pattern wires. In this case, the current conversion circuit 51 and the voltage conversion circuit 53 are provided separately outside the current/voltage detector 3c.

Figure 32:
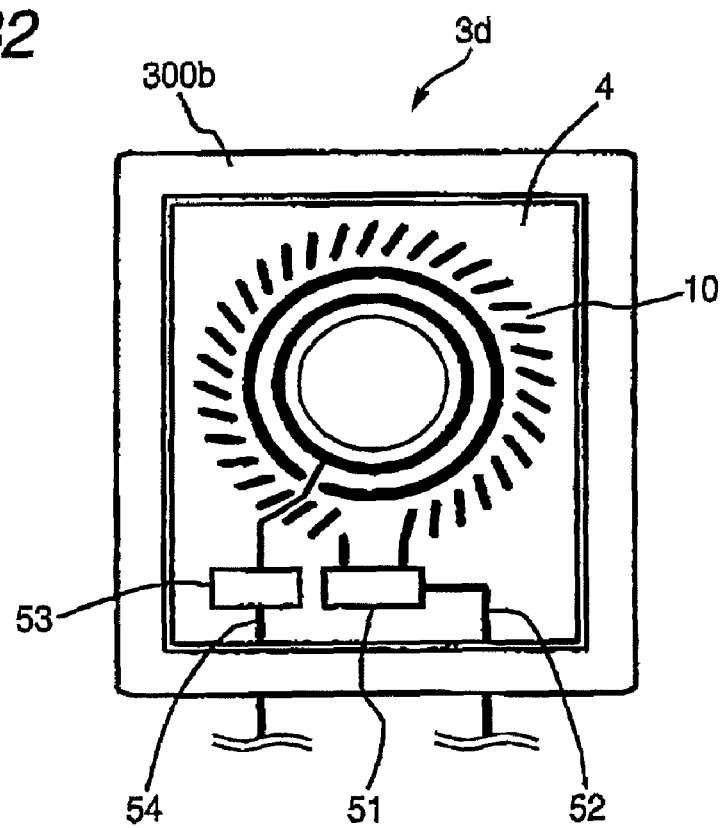
FIG. 32 is a diagram showing a current/voltage detector 3d as a modification of the current/voltage detector 3b.

FIG. 32 shows a current/voltage detector 3d as a modification of the current/voltage detector 3b. Here, a cover 301b is not shown. As shown in FIG. 32, the current conversion circuit 51 and the voltage conversion circuit 53 may be provided on the current/voltage detection printed board 4. Moreover, the output wire of the current conversion circuit 51 and the output wire of the voltage conversion circuit 53 may be partially pattern wires or may be overall wires other than the pattern wires.

Although an example where the current/voltage detector 3a, 3b, 3c, or 3d is provided at the input terminal 63a of the impedance matching device has been described in the above description, the invention is not limited thereto. For example, the detector may be provided at an output terminal of the high-frequency power supply device 61, or may be provided at the output terminal 63b of the impedance matching device. Moreover, as described above, there is a difference in current and voltage at the input terminal 63a and the output terminal 63b (the same as the input terminal of the load 65) of the impedance matching device). For this reason, when the detector is provided at the output terminal 63b of the impedance matching device or the input terminal of the load 65, in order to extend an insulation distance, it is preferable to use a power transmission conductor 68 having a large diameter or a thick insulator 69 covering the periphery of the power transmission conductor 68 in consideration of the difference. Furthermore, the detector may be used for other systems than the high-frequency power supply system.

(6) Fixing Method

When the outer diameter of the insulator 69 and the inner diameter of the penetration hole 303 provided in the casing main body 300 are substantially consistent with each other, the insulator 69 and the current/voltage detector 3b can be fixed. However, actually, the insulator 69 having an outer diameter smaller than the inner diameter of the penetration hole may be used. In this case, a gap occurs between the insulator 69 and the casing main body 305. As such, if the gap exists, when the power transmission conductor 66 and the current/voltage detector 3b are mounted on the impedance matching device 63, the relative position therebetween may not be constant according to mounting devices. That is, the relative position between the power transmission conductor 66 and the current/voltage detection printed board 4 may not be constant. In this case, when a plurality of devices are formed, a variation in detection value of the individual devices occurs. For this reason, when the gap is large, it is preferable to keep the relative position between the power transmission conductor 66 and the current/voltage detector 3b constant.

Figure 33:
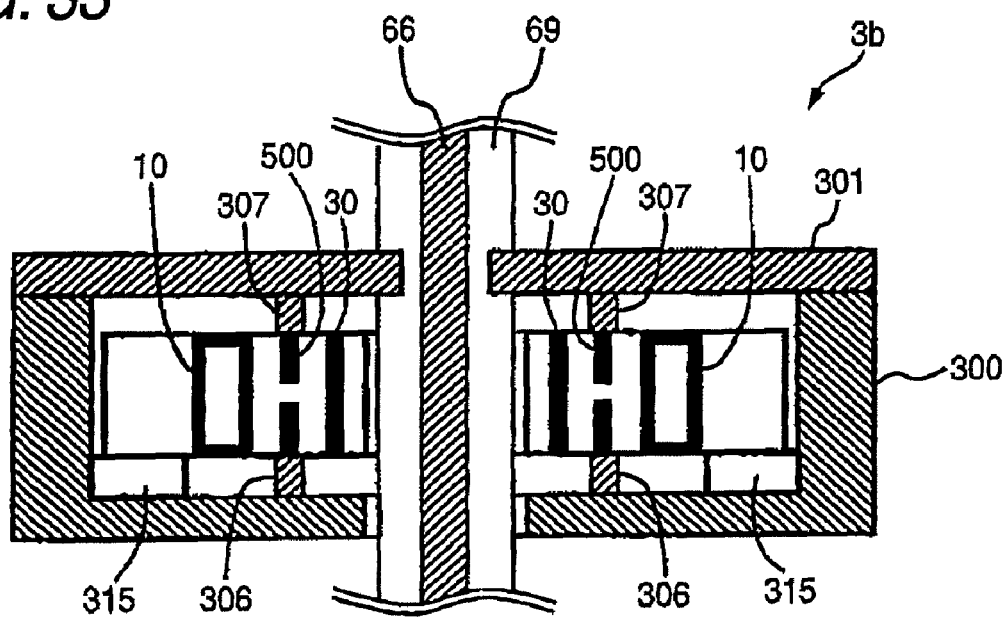
FIG. 33 is a diagram showing a fixing method of the insulator 69.

FIG. 33 is a diagram showing a fixing method of the insulator 69. As shown in FIG. 33, a concave portion is provided in the insulator 69, and a cover 301 is fitted into the concave portion. With this configuration, the insulator 69 can be fixed by the cover 301. Moreover, the cover 301 may be divided into two parts at a portion near the penetration hole. If doing so, even through the outer diameter of the insulator 69 is smaller than the inner diameter of the penetration hole 303, the relative position between the power transmission conductor 66 and the current/voltage detection printed board 4 can be substantially kept constant.

Like FIG. 33, when a cover is only provided at the upper portion of the casing, the insulator 69 may not be stably fixed. In this case, in order to stabilize the insulator 69, a mounting part (not shown) for fixing the insulator 69 may be provided at the lower portion of the casing main body 300 (as viewed from the paper).

Figure 34:
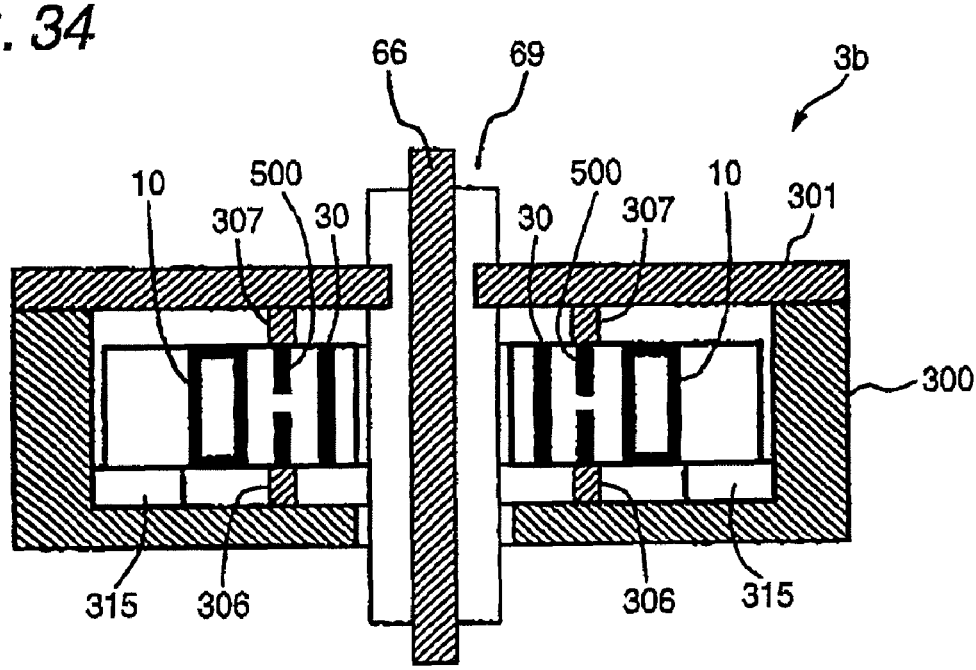
FIG. 34 is a diagram showing a case where the sizes of the power transmission conductor 66 and the insulator 69 in the current/voltage detector 3b of FIG. 33 are suited to the size of the current/voltage detector 3b.
Figure 35:
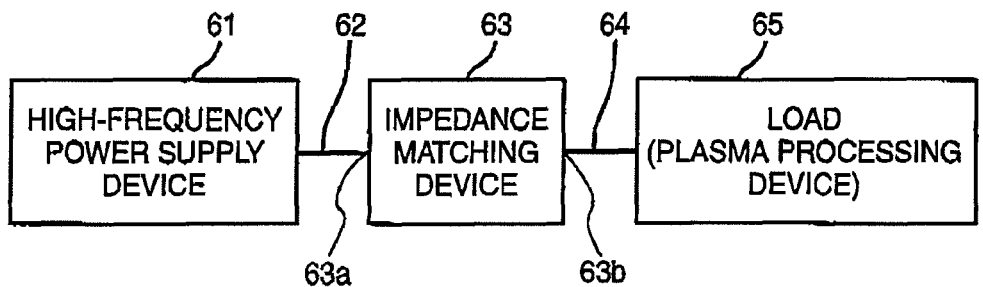
FIG. 35 is a block diagram of an example of a high-frequency power supply system that uses an impedance matching device.

FIG. 34 is a diagram showing a case where the sizes of the power transmission conductor 66 and the insulator 69 in the current/voltage detector 3b of FIG. 33 are suited to the size of the current/voltage detector 3b.

Like FIG. 33, when the insulator 69 is fixed to the current/voltage detector 3b, in order to improve maintenance, as shown in FIG. 34, the sizes of the power transmission conductor 66 and the insulator 69 may be suited to the size of the current/voltage detector 3b, such that the power transmission conductor 66 and the insulator 69 can be removed from the current/voltage detector 3b. With this configuration, maintenance can be improved. Though not shown in FIG. 34, a connection portion for connection to another conductor is provided in the power transmission conductor 66.

Although a case where the power transmission conductors 66 and 68 are a cylindrical copper rod, that is, has a circular shape in section has been described in the above description, the invention is not limited thereto. For example, a conductor having an elliptical shape or a rectangular shape in section maybe used. Furthermore, although a case where the penetration hole 401 of the current/voltage detection printed board 4 has a circular shape has been described, the invention is not limited thereto. For example, an elliptical shape or a rectangular shape may be used.

As described above, there exist various kinds of the shield portion, the coiled wire 10, and the ring-shaped wire 30 constituting the current/voltage detection printed board 4. Therefore, other combinations than those described above can be made.

What is claimed is:
1. A current/voltage detector, comprising:
a casing main body formed of an electrical conductor; and
a printed board mounted within the casing main body, wherein the printed board comprises:
a first shield portion, configured to reduce an influence of an electric field, and comprising a first plurality of through holes arranged in a first circuit, the first shield portion electrically connected to the casing main body; and
a second shield portion, configured to reduce the influence of the electric field, and comprising a second plurality of through holes arranged in a second circuit, the second shield portion electrically connected to the casing main body, wherein
the second circuit is arranged alongside the first circuit and surrounds the first circuit.

2. The current/voltage detector according to claim 1, wherein each of the first shield portion and the second shield portion includes an unshielded portion.

3. The current/voltage detector according to claim 1, wherein no unshielded portion is provided with respect to the first shield portion and the second shield portion.

4. The current/voltage detector according to claim 1, wherein each of the first plurality of through holes includes an upper through hole and a lower through hole and does not pass through the printed board.

5. The current/voltage detector according to claim 1, wherein each of the first plurality of through holes and each of the second plurality of through holes includes an upper through hole and a lower through hole and does not pass through the printed board.

6. A printed board, configured to detect an AC current flowing in a power transmission conductor and an AC voltage generated in the power transmission conductor, the power transmission conductor being used as an AC power transmission path, the printed board comprising:
a first wire, configured to detect the AC voltage;
a shield portion, configured to reduce an influence of an electric field of the AC current in combination with a casing accommodating the printed board, at least a part of the shield portion being formed with a plurality of through holes; and
a second wire, configured to detect the AC current, wherein:
the printed board is formed with a penetration hole;
the first wire is provided between the penetration hole and the shield portion and capacitively couples to the power transmission conductor when the power transmission conductor is positioned within the penetration hole; and
the shield portion is provided between the first wire and the second wire.

7. The printed board according to claim 6, wherein the plurality of through holes are arranged in a substantially circular shape.

8. The printed board according to claim 6, wherein each of the plurality of through holes includes an upper through hole and a lower through hole and does not pass through the printed board.

9. A printed board, configured to detect an AC current flowing in a power transmission conductor and an AC voltage generated in the power transmission conductor, the power transmission conductor being used as an AC power transmission path, the printed board comprising:
a first wire, configured to detect the AC voltage;
a shield portion, configured to reduce an influence of an electric field of the AC current in combination with a casing accommodating the printed board, at least a part of the shield portion being formed with a plurality of through holes; and
a second wire, configured to detect the AC current, wherein the printed board is formed with a penetration hole, the first wire is provided between the penetration hole and the shield portion, the shield portion is provided between the first wire and the second wire, and the plurality of through holes are arranged in a substantially circular shape and in at least two lines.

10. A detector, configured to detect an AC current flowing in a power transmission conductor and an AC voltage generated in the power transmission conductor, the power transmission conductor being used as an AC power transmission path, the detector comprising:

a casing; and a printed board, comprising:

a first wire, configured to detect the AC voltage;

a shield portion, configured to reduce an influence of an electric field of the AC current in combination with the casing accommodating the printed board, at least a part of the shield portion being formed with a plurality of through holes; and a second wire, configured to detect the AC current, wherein:

the printed board is formed with a penetration hole;

the first wire is provided between the penetration hole and the shield portion and capacitively couples to the power transmission conductor when the power transmission conductor is positioned within the penetration hole;

the shield portion is provided between the first wire and the second wire; and the casing covers the printed board excluding the penetration hole.

11. The detector according to claim 10, wherein the plurality of through holes are arranged in a substantially circular shape.

12. The detector according to claim 10, wherein the shield portion includes an unshielded portion where the influence of the electric field is not reduced.

13. The detector according to claim 12, wherein the unshielded portion is provided between a first surface and a second surface of the printed board.

14. The detector according to claim 12, wherein the unshielded portion is provided between the printed board and the casing.

15. The detector according to claim 10, wherein the casing includes:

a main body, configured to fix the printed board; and a cover portion, configured to accommodate the printed board.

16. The detector according to claim 10, wherein the printed board includes a plurality of layers laminated to each other;

the first wire is formed with a plurality of through holes arranged at the periphery of the penetration hole, the through holes penetrating between at least a part of the layers; and the first wire includes a pattern wire connecting the through holes.

17. The detector according to claim 10, wherein the AC current has a frequency of a radio frequency band.

18. The detector according to claim 10, wherein each of the plurality of through holes includes an upper through hole and a lower through hole and does not pass through the printed board.

19. The detector according to claim 10, wherein the casing includes a casing shield portion comprising an electrical conductor, and the plurality of through holes are connected to the casing shield portion.

20. A detector, configured to detect an AC current flowing in a power transmission conductor and an AC voltage generated in the power transmission conductor, the power transmission conductor being used as an AC power transmission path, the detector comprising:

a casing; and a printed board, comprising:

a first wire, configured to detect the AC voltage;

a shield portion, configured to reduce an influence of an electric field of the AC current in combination with the casing accommodating the printed board, at least a part of the shield portion being formed with a plurality of through holes; and a second wire, configured to detect the AC current, wherein the printed board is formed with a penetration hole, the first wire is provided between the penetration hole and the shield portion, the shield portion is provided between the first wire and the second wire, the casing covers the printed board excluding the penetration hole, and the plurality of through holes are arranged in a substantially circular shape and in at least two lines.

* * * * *